US012020990B2

(12) United States Patent
Smith et al.

(10) Patent No.: US 12,020,990 B2
(45) Date of Patent: Jun. 25, 2024

(54) METHOD FOR THRESHOLD VOLTAGE TUNING THROUGH SELECTIVE DEPOSITION OF HIGH-K METAL GATE (HKMG) FILM STACKS

(71) Applicant: Tokyo Electron Limited, Tokyo (JP)

(72) Inventors: Jeffrey Smith, Clifton Park, NY (US); Kandabara Tapily, Mechanicville, NY (US); Lars Liebmann, Mechanicville, NY (US); Daniel Chanemougame, Niskayuna, NY (US); Mark Gardner, Cedar Creek, TX (US); H. Jim Fulford, Marianna, FL (US); Anton J. Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/580,116

(22) Filed: Jan. 20, 2022

(65) Prior Publication Data
US 2022/0148924 A1    May 12, 2022

Related U.S. Application Data

(62) Division of application No. 16/924,937, filed on Jul. 9, 2020, now Pat. No. 11,264,289.
(Continued)

(51) Int. Cl.
*H01L 21/8238*    (2006.01)
*H01L 27/092*    (2006.01)
(Continued)

(52) U.S. Cl.
CPC ............ *H01L 21/823842* (2013.01); *H01L 21/823821* (2013.01); *H01L 21/823857* (2013.01);
(Continued)

(58) Field of Classification Search
CPC ..... H01L 21/823842; H01L 21/823857; H01L 21/823821; H01L 27/0922; H01L 27/0924; H01L 29/42392; H01L 29/78696
See application file for complete search history.

(56) References Cited

U.S. PATENT DOCUMENTS 10,056,254 B2 * 8/2018 Balakrishnan ........ H01L 29/495
2004/0171222 A1   9/2004 Gao et al.
(Continued)

FOREIGN PATENT DOCUMENTS

KR      10-1758996 B1      7/2017
WO   WO 2013/063351 A1    5/2013

OTHER PUBLICATIONS

International Search Report and Written Opinion of the International Searching Authority dated Oct. 23, 2020 in PCT/US2020/041647, 11 pages.

*Primary Examiner* — Michael M Trinh
(74) *Attorney, Agent, or Firm* — Oblon, McClelland, Maier & Neustadt, L.L.P.

(57) ABSTRACT

A method for microfabrication of a three dimensional transistor stack having gate-all-around field-effect transistor devices. The channels hang between source/drain regions. Each channel is selectively deposited with layers of materials designed for adjusting the threshold voltage of the channel. The layers may be oxides, high-k materials, work function materials and metallization. The three dimensional transistor stack forms an array of high threshold voltage devices and low threshold voltage devices in a single package.

20 Claims, 35 Drawing Sheets

Related U.S. Application Data

(60) Provisional application No. 62/872,943, filed on Jul. 11, 2019.

(51) Int. Cl.
 *H01L 29/423* (2006.01)
 *H01L 29/786* (2006.01)

(52) U.S. Cl.
 CPC ...... *H01L 27/0922* (2013.01); *H01L 27/0924* (2013.01); *H01L 29/42392* (2013.01); *H01L 29/78696* (2013.01)

(56) References Cited

U.S. PATENT DOCUMENTS

| | | |
|---|---|---|
| 2010/0320545 A1 | 12/2010 | Jagannathan et al. |
| 2013/0200467 A1 | 8/2013 | Edge et al. |
| 2014/0363960 A1* | 12/2014 | Kim ................. H01L 21/28176 438/585 |
| 2017/0033020 A1 | 2/2017 | Machkaoutsan |
| 2018/0151573 A1* | 5/2018 | Li ....................... H01L 29/4966 |
| 2018/0294192 A1* | 10/2018 | Bao ..................... H01L 27/088 |
| 2018/0374926 A1* | 12/2018 | Lee ..................... H01L 27/1251 |
| 2019/0172828 A1 | 6/2019 | Smith ............. H01L 21/823842 |
| 2020/0006356 A1* | 1/2020 | Ando ................ H01L 27/1104 |
| 2020/0013898 A1* | 1/2020 | Yim ............... H01L 21/823857 |
| 2020/0035678 A1 | 1/2020 | Lee |
| 2021/0098457 A1 | 4/2021 | Cheng |
| 2021/0134951 A1 | 5/2021 | Chen |

* cited by examiner

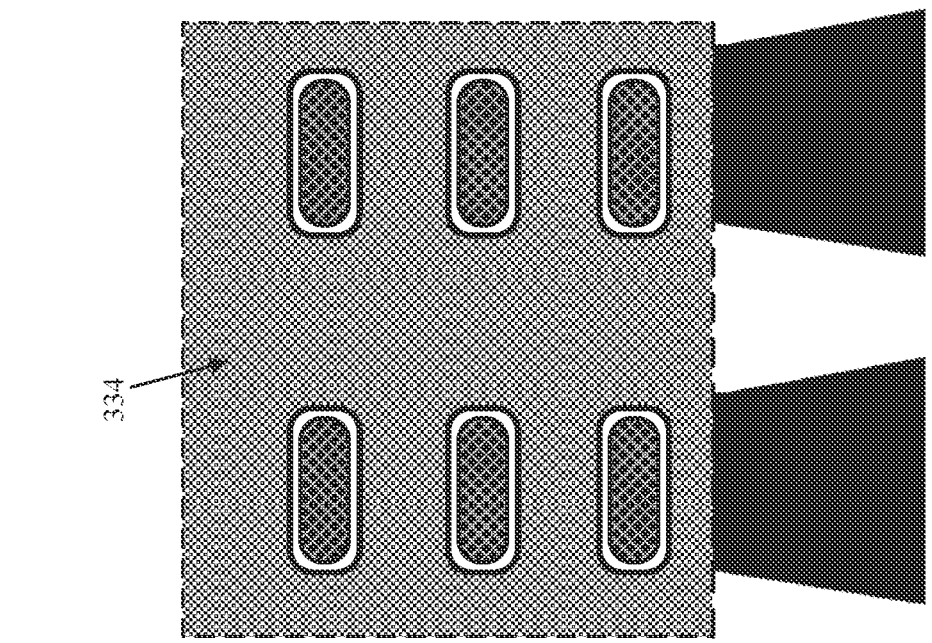
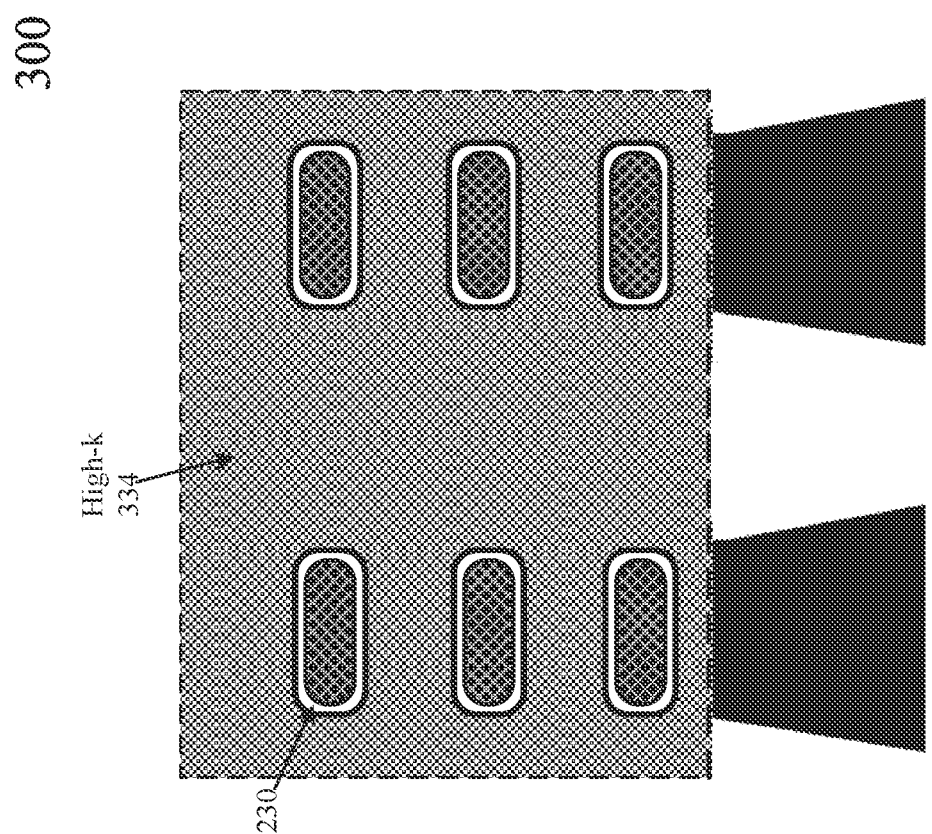
FIG. 3

METHOD FOR THRESHOLD VOLTAGE TUNING THROUGH SELECTIVE DEPOSITION OF HIGH-K METAL GATE (HKMG) FILM STACKS

CROSS SECTION TO RELATED APPLICATIONS

This application is a divisional of U.S. application Ser. No. 16/924,937, filed Jul. 9, 2020, which is based upon and claims priority from U.S. provisional application 62/872,943, entitled "Method for Threshold Voltage Tuning Through Selective Deposition of High-K Metal Gate (HKMG) Film Stacks" filed on Jul. 11, 2019; the entire contents of which are incorporated herein by reference.

FIELD OF THE INVENTION

This disclosure relates to microelectronic devices including semiconductor devices, transistors, and integrated circuits, including methods of microfabrication, adjusting transistor threshold voltages ($V_t$) through selective deposition processes.

BACKGROUND OF THE INVENTION

The manufacture of a semiconductor device (especially on the microscopic scale) requires various fabrication processes to be executed, such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration, that is, the vertical stacking of multiple devices, aims to overcome scaling limitations experienced in planar devices by increasing transistor density in volume rather than area. Although device stacking has been successfully demonstrated and implemented by the flash memory industry with the adoption of 3D NANO, application to random logic designs is substantially more difficult.

Threshold voltage (Vi) is the minimum voltage needed to activate a transistor within a CMOS (complementary metal-oxide-semiconductor) device. As CMOS devices have scaled down, there has been an increase in the number of different threshold voltages used within a given design. Using different threshold voltages enables designers to optimize specific portions of a chip to operate at higher performance or with lower power as needed. Conventional devices manufactured in conventional Foundry N5 technology nodes can incorporate as many as five different threshold voltages, which requires significant complexity within the chip manufacturing process.

Threshold voltage ($V_t$) can be "tuned" or created through several different approaches. One approach is to use channel doping to achieve different threshold voltages. As devices have scaled down in size and channel widths for leading-edge FINFET devices approach 50 Angstroms, and channel heights for nanowire/nanosheet devices likewise approach 50 Angstroms, channel doping is no longer a valid option for $V_t$ tuning given the significantly reduced mobility with the doped channel coupled with the smaller dimensions. For such small channel dimensions, a single dopant atom can negatively impact the performance of the device. Further, the variability of the dopants within the channel is statistically very hard to control and these variations on atom-level scales may have significant impact on the threshold voltage of the device, thus the application of channel doping can generate multiple $V_t$ tuning "flavors" or values which are not desired within a corresponding device.

Other approaches for $V_t$ tuning of CMOS devices have been through work function metal (WFM) stack engineering, for example through the addition of multiple metal stack films surrounding the channel, or through increase of the work function metal stack thickness. Because the work function of the WFM stack is highly dependent upon the thickness variation within each film of the work function metal stack, complex integration processes have been developed using atomic layer deposition (ALO) of etch stop layers (ESL) and work function metal (WFM), multiple masking steps using expensive lithography operations, and wet etches in order to impart some controlled change in the work function metal stack to control threshold voltage. This approach has become the primary approach for threshold voltage tuning for state-of-the-art technology nodes but has come with increased integration and manufacturing complexity in the attempt to achieve the multiple threshold voltage requirements.

Accordingly, it is one object of the present disclosure to provide methods and systems in which threshold voltages ($V_t$) may be adjusted through selective deposition processes. Such processes can be adopted across FINFET, nanowire/nanosheet, complementary FET, and vertical FET devices.

SUMMARY

Aspects of the present disclosure describe methods for adjusting transistor threshold voltages ($V_t$) through selective deposition processes.

An exemplary embodiment describes a method of microfabrication. A substrate is having channels for gate-all-around field-effect transistor devices is used. The channels include vertical stacks of channels positioned adjacent to each other in which individual channels extend horizontally between source/drain regions. In the vertical stacks of channels, at least one channel is positioned above a second channel. The channels include at least four designated channel types including high voltage PMOS channels, high voltage NMOS channels, low voltage PMOS channels and low voltage NMOS channels.

In the exemplary embodiment, a first high-k dielectric is selectively deposited all around uncovered channels including high voltage PMOS channels, high voltage NMOS channels, low-voltage PMOS channels and low voltage NMOS channels. A first work function metal is selectively deposited on high voltage NMOS channels and low voltage NMOS channels while high voltage PMOS channels and low voltage PMOS channels are covered. A second work function metal is selectively deposited on high voltage PMOS channels and low voltage PMOS channels while high voltage NMOS channels and low voltage NMOS channels are covered. A third work function metal is selectively deposited on high voltage PMOS channels and high voltage NMOS channels while low voltage PMOS channels and low voltage NMOS channels are covered. Conductive metal material is deposited on high voltage PMOS channels, high voltage NMOS channels, low voltage PMOS channels and low voltage NMOS channels after deposition of work function metals.

Another exemplary embodiment describes a method of microfabrication of vertical stacks of nano-channels, each vertical stack having a different voltage threshold.

Another exemplary embodiment describes a three dimensional transistor stack, comprising a substrate having channels for gate-all-around field-effect transistor devices, the channels including vertical stacks of channels positioned adjacent to each other in which individual channels extend horizontally between source/drain regions, wherein, in each vertical stack of channels, at least one channel is positioned above a second channel, a first vertical stack of high voltage NMOS channels, wherein each channel is surrounded by a first high-k dielectric, a first work function metal, a third work function metal, and a conductive metal material, a second vertical stack of low voltage NMOS channels, wherein each channel is surrounded by the first high-k dielectric, the first work function metal, and a conductive metal material, a third vertical stack of high voltage PMOS channels, wherein each channel is surrounded by the first high-k dielectric, a second work function metal, a third work function metal, and a conductive metal material, a fourth vertical stack of low voltage PMOS channels, wherein each channel is surrounded by the first high-k dielectric, the second work function metal, and a conductive metal material, a capping material over the conductive metal material, and an input gate contact connected to the conductive metal material.

The different steps as described herein have been presented for the sake of clarity. In general, these steps can be performed in any suitable order. Additionally, although each of the different features, techniques, configurations, etc. herein may be discussed in different places of this disclosure, it is intended that each of the concepts may be executed independently of each other or in combination with each other. Accordingly, the present invention can be embodied and viewed in many different ways.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 illustrates atomic layer deposition of the high-k film over the interface layer of the silicon nanosheet.

DETAILED DESCRIPTION

Figure 1:
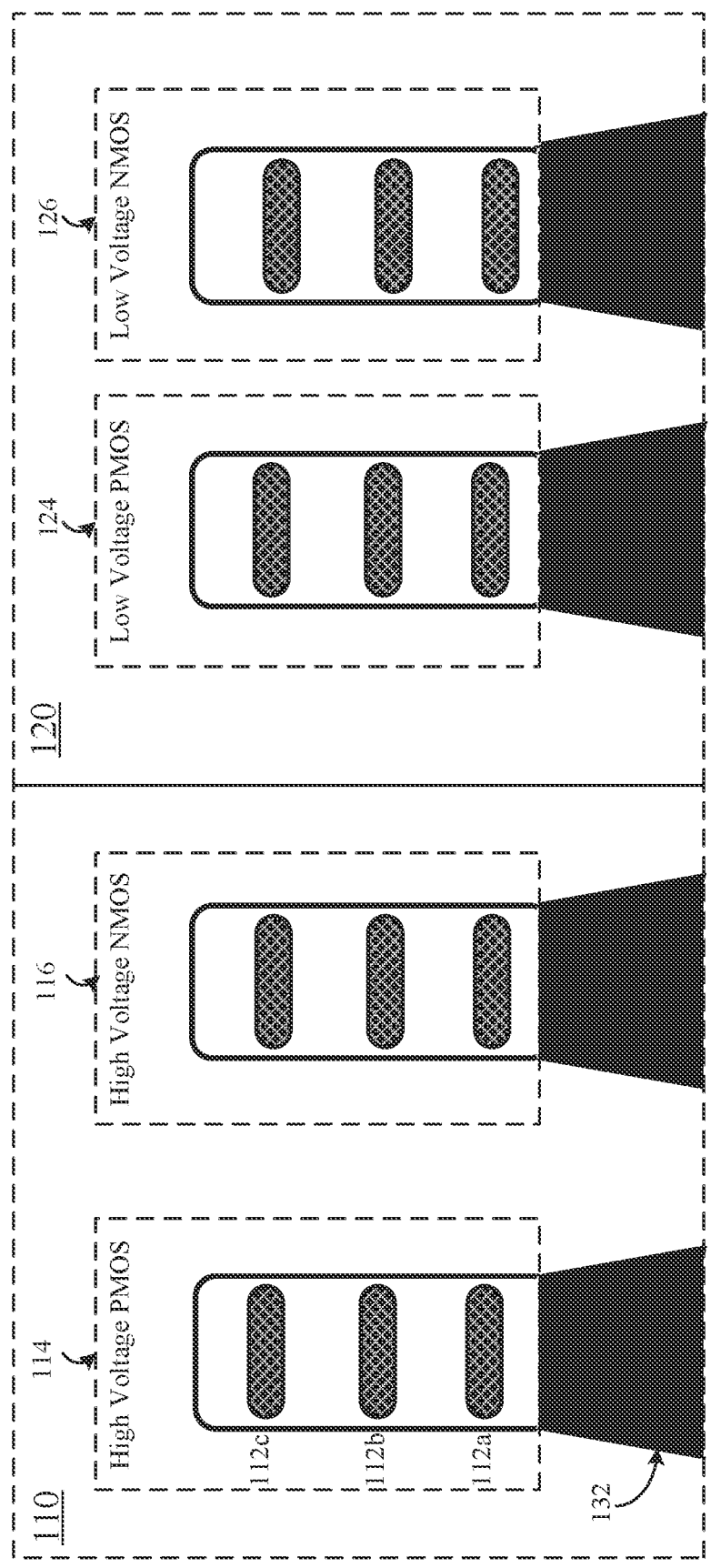
FIG. 1 is cross-section taken through the common gate following nanosheet release for high and low threshold voltage conditions.

In the drawings, like reference numerals designate identical or corresponding parts throughout the several views.

Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate." "about," and similar terms generally refer to ranges that include the identified value within a margin of 20%, 10%, or preferably 5%, and any values therebetween.

Aspects of the present disclosure are directed to methods of microfabrication of vertical stacks of nano-channels, each vertical stack having a different voltage threshold, and a three dimensional transistor stack having channels with different voltage thresholds.

A multi-gate MOSFET refers to a metal-oxide-semiconductor field-effect transistor that incorporates more than one gate into a single device. The multiple gates may be controlled by a single gate electrode, wherein the multiple gate surfaces act electrically as a single gate, or by independent gate electrodes.

A FinFET (fin field-effect transistor is a type of non-planar transistor, or "2D" transistor. The FinFET is a variation on traditional MOSFETs distinguished by the presence of a thin silicon "fin" inversion channel on top of the substrate, allowing the gate to make two points of contact: the left and right sides of the fin. The thickness of the fin (measured in the direction from source to drain) determines the effective channel length of the device. The wrap-around gate structure provides better electrical control over the channel, reducing the leakage current and overcoming other short-channel effects.

A gate-all-around (GAA) FET, abbreviated GAAFET is similar in concept to a FinFET except that the gate material surrounds the channel region on all sides. Depending on design, gate-all-around FETs can have two or four effective gates. Gate-all-around FETs may utilize a stack of silicon nanowires with a gate completely surrounding it.

The gate-all-around assembly resembles a MOSFET, where a gate is sandwiched between the source and a drain and has fins similar to a FinFET. But unlike a conventional FinFET, where the fins are positioned vertically, the FinFET is turned on its side in gate-all-around.

A gate-all-around FET may incorporate three or more nanowires. The nanowires, which form the channels, are suspended and run from the source to the drain. A high-k/metal-gate structure, which controls the flow of the current, fills the gap between the source and drain.

A typical high-k metal gate (HKMG) integration process for a FINFET CMOS device includes: (a) removing polysilicon or amorphous silicon through a wet etch process within the replacement gate, (b) removing the chemical oxide protecting the FIN structures within the replacement gate, (c) the formation of an interface silicon oxide layer over the cleaned FINs in which the interface oxide may be in the range of 8 to 12 Angstroms in thickness for core logic sections for current state-of-the-art devices, and forming a thickness well above 12 Angstroms for high voltage portions of the chip such as at the input and output regions, (d) deposition of a high-k (HK) dielectric material such as hafnium oxide (HfO) over the interface layer through an atomic layer deposition process, where the thickness of the high-k film can vary from 10 Å to 20 Å in the core logic section, (e) deposition of a titanium nitride (TiN) capping layer over the HK film through atomic layer deposition or conformal chemical vapor deposition (CVD), (f) deposition of an etch stop layer such as tantalum nitride (TaN) through atomic-layer deposition or conformal CVD deposition, (g) deposition of polysilicon or amorphous silicon into the replacement gate through a chemical vapor deposition (CVD) or physical vapor deposition (PVD) process, (h) a high temperature anneal to drive reliability for the HK film, (i) removal of the polysilicon or amorphous silicon fill from the replacement gate, (j) deposition of a p-type work function metal through atomic layer deposition or conformal CVD across both NMOS and PMOS gates, where conventional p-type work function metals include TiN, (k) blocking of the NMOS and PMOS gates with a filling material such as spin-on-carbon (SOC). (l) patterning of a "blocking" mask that will open only the NMOS portions of the replacement gate while blocking the PMOS portion, (m) once the NMOS portion of the replacement gate is opened and the SOC material etched away from within only the NMOS portion of the replacement gate, the TiN is wet-etched where the underlying TaN etch stop layer (ESL) prevents any removal of the TiN cap deposited over the top the HK. Optionally a second wet etch can be used to then selectively remove the TaN without etching the underlying TiN, (n) the SOC is then removed from the PMOS portion of the replacement gate to open up both NMOS and PMOS portions, (o) the n-type work function metal such as TiAl, TiAlN, or TiAlC is then deposited using atomic layer deposition or conformal CVD across both NMOS and PMOS gates, (p) a liner material such as TiN or TaN is then deposited within both NMOS and PMOS gates through atomic layer deposition or conformal CVD as a means for providing good barrier and adhesion for the subsequent deposition of a highly conductive filling metal such as tungsten, cobalt, ruthenium, or even aluminum or co-alloys of aluminum.

Barrier layers within the replacement gate trench, and wet etches are used to remove metals and barrier films where the replacement gate trenches are opened by means of a topological patterning mask. The patterning mask cannot be used for the atomic layer deposition of the work function and barrier metal processes, because the deposition process itself is isotropic and would be deposited not only along the channel and within the sidewall of the replacement gate, but along the topological blocking mask as well, making it difficult to then remove the blocking mask pattern without also removing the deposition done around the intended channel. By incorporating the topological blocking mask pattern into the wet etch process, selectivity can be given to the subtractive metal etching process where the desired film can be removed without interfering with the pattern block mask.

This approach for threshold voltage adjustment poses challenges when multiple threshold voltages are desired. For the example above, there was a single threshold voltage for NMOS and PMOS. For the case of two different threshold voltages for NMOS and PMOS the process integration becomes more extensive when using a work function metal stack and thickness for the tuning. A NMOS device that has a low threshold voltage condition will look similar to the NMOS from the example above, where the n-type work function metal is deposited directly over the TiN cap covering the HK film. For the high threshold voltage condition for NMOS, the work function metal stack can contain TaN barrier layers which have not been wet-etched during the $V_t$ tuning steps. For a PMOS low voltage condition, the work function metal stack will look similar to the previous example where TaN is deposited over the TiN cap covering the HK and then work function metal titanium aluminum (TiAl), titanium aluminum nitride (TiAlN), or aluminum doped titanium carbide (TiAlC) is deposited over the TiN.

The high threshold voltage PMOS work function metal stack can contain non-removed TaN barrier layers, some type of sequential TiN-on-TiN deposition without any TaN ESL, or even multiple pairs of TaN/TiN depositions from the integration, which in turn will likewise have the final n-type work function metal deposited over the top. This addition of just a single extra threshold voltage condition to both NMOS and PMOS will drive an increase in etch-stop layer deposition steps, lithography "block" patterning processes, as well as a number of additional wet etch steps to remove unwanted films from the low threshold voltage conditions. Integration processes can be optimized so as to decrease the number of associated blocking and etch steps removed, but are done at the expense of having a number of additional metals in the high-$V_t$ work function metal stacks, particularly for the PMOS gate.

The following figures illustrate an integration of two threshold voltage conditions for NMOS and PMOS. Each step sequence shows two separate sequences that parallel with one another in which the left-hand side sequence shows the high threshold voltage integration while the right-hand side image shows the low threshold voltage integration. Within both sequences, the high-k metal gate (HKMG) shown is a common gate comprising a PMOS gate on the left-hand side of each individual image, and an NMOS gate on the right-hand side of each individual image.

FIG. 1 illustrates a cross-section taken by a plane through a common gate of a gate-all-around transistor block following nanosheet release for a high threshold voltage condition 110 and a low threshold voltage condition 120. The common gate will be processed to have a high voltage PMOS stack (114), a high voltage NMOS stack (116), a low voltage PMOS stack and a low voltage NMOS stack. The stacks include vertical stacks of channels (see, for example, 112a, 112b, 112c of stack 114) positioned adjacent to each other in which individual channels extend horizontally between source/drain regions. In the vertical stacks, at least one channel (112c for example) is positioned above a second channel (112b). The final processed stacks will include at least four designated channel types including high voltage PMOS stacks 114, high voltage NMOS stacks 116, low voltage PMOS stacks 124 and low voltage NMOS stacks 126.

Figure 2:
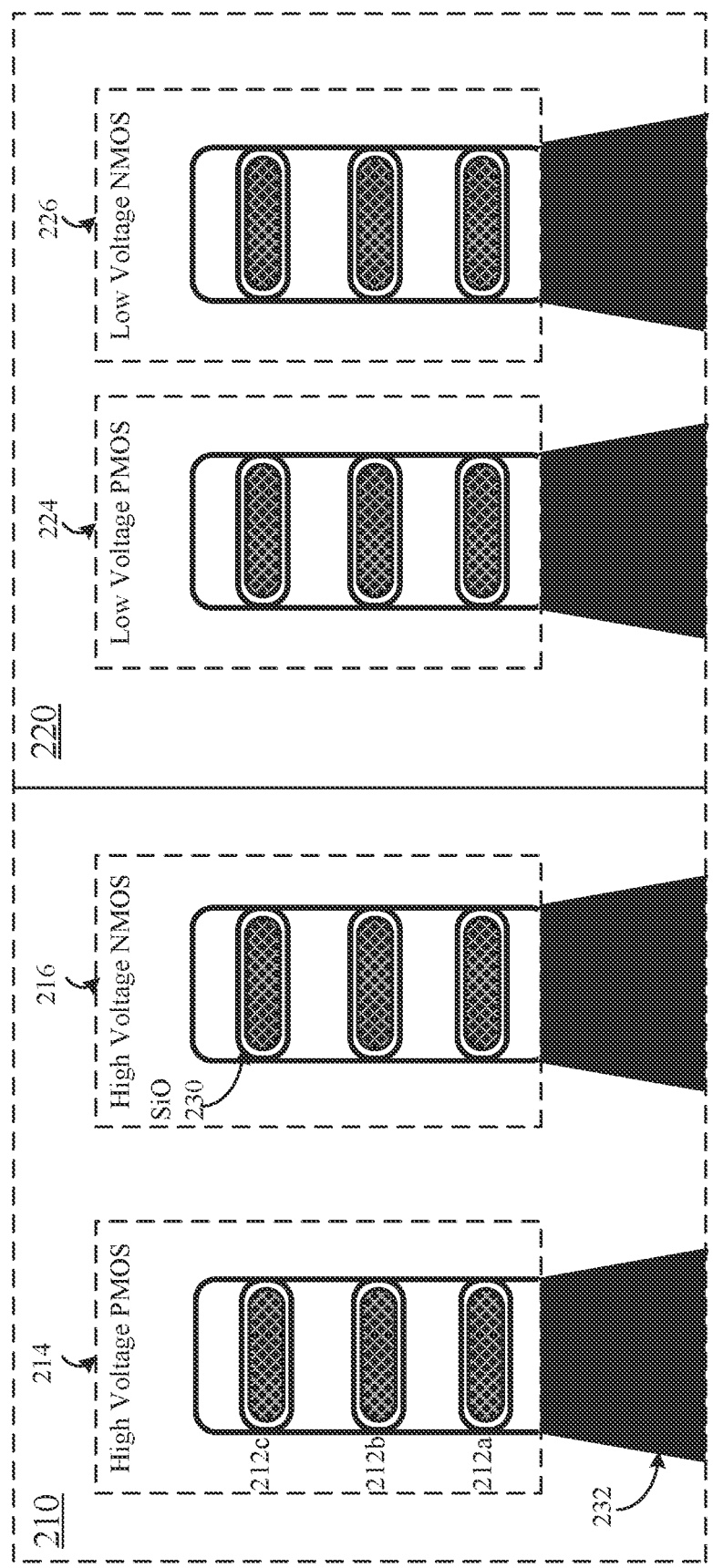
FIG. 2 illustrates the interface silicon oxide layer growth around the silicon nanosheet channels.

FIG. 2 shows an interface silicon oxide layer (one is shown as 230) grown on the outside surface of each silicon nanosheet channel. Item 232 represents the lower silicon block, which is an un-etched part of the gate structure. Each channel stack is isolated from adjacent channel stacks by dielectric material, not shown for clarity.

FIG. 3 illustrates the atomic layer deposition of a high-k film 334 over the interface layer of the silicon nanosheet. Since the high-k deposition of hafnium oxide is performed through atomic layer deposition, the deposition will cover the sidewalls of the replacement gate trench as well as the bottom of the replacement gate trench with a thickness equivalent to that deposited around the nanosheet. Any deposition of dipole forming materials such as aluminum or hafnium oxide would be done either in-situ or as a secondary deposition after the high-k film.

Figure 4:
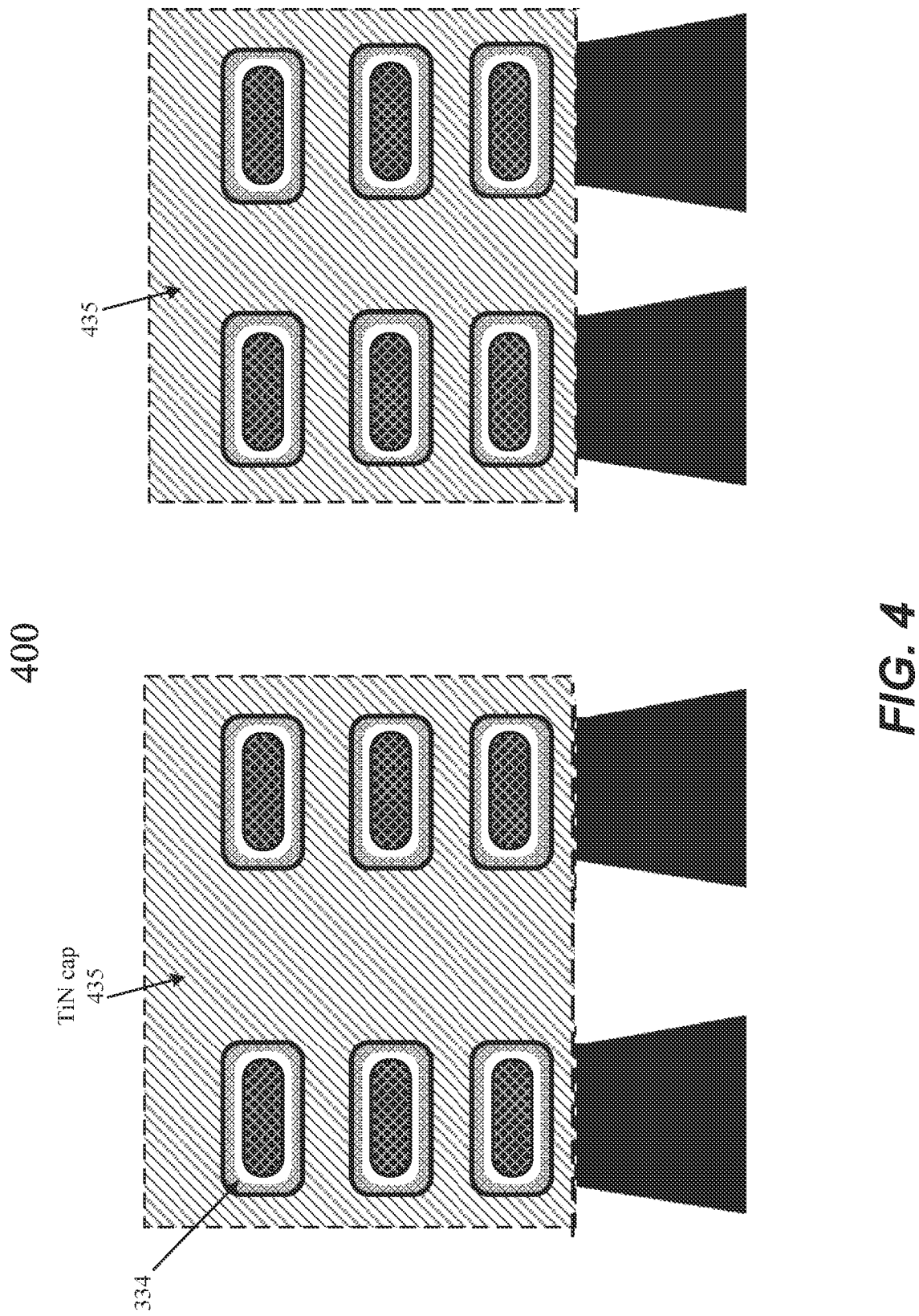
FIG. 4 depicts the isotropic deposition of TiN cap over the top of the high-k film.

FIG. 4 depicts the isotropic deposition of a TiN cap 435 over the top the high-k film 334 which is followed by a subsequent anneal process.

Figure 5:
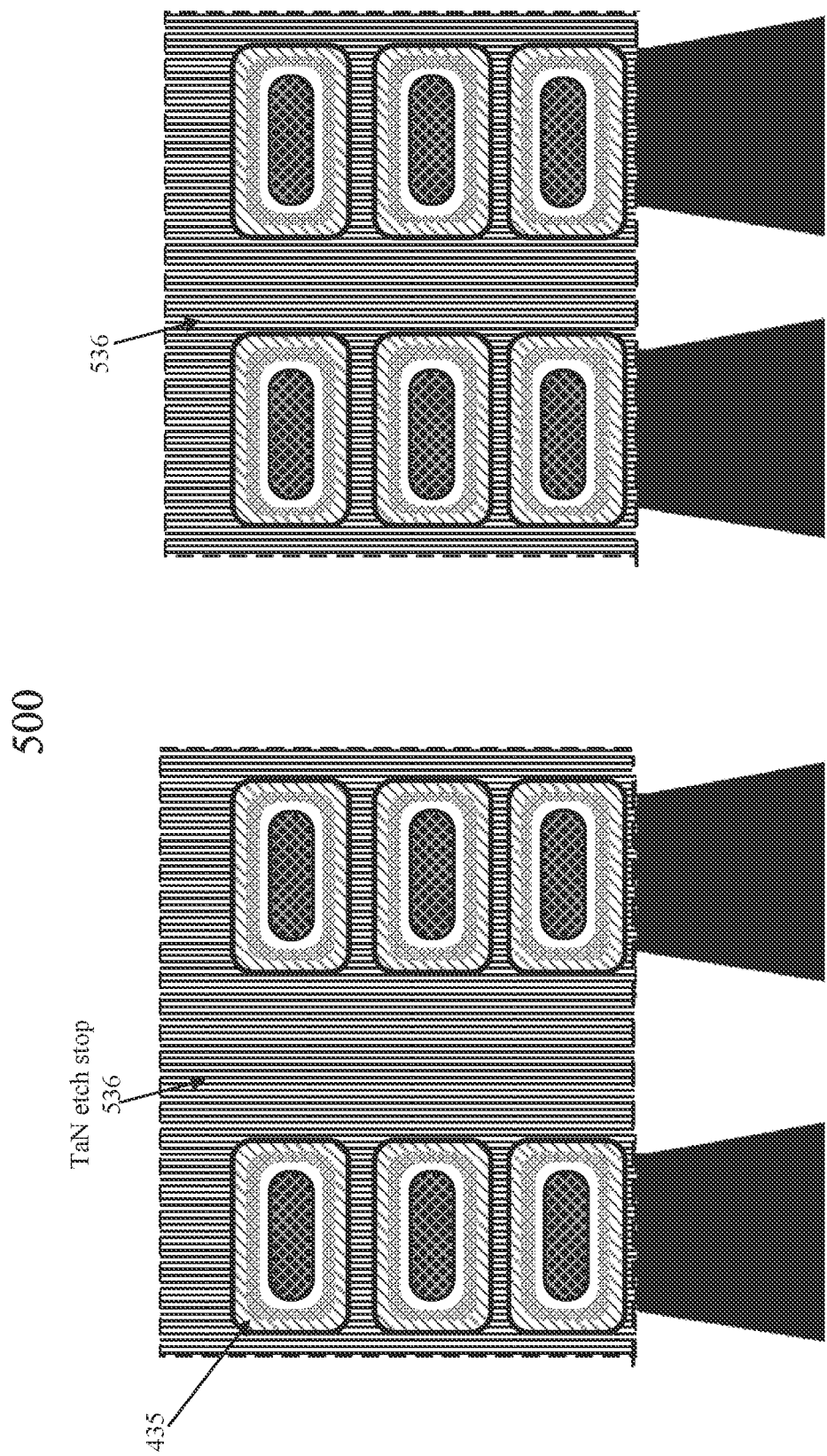
FIG. 5 depicts the isotropic deposition of TaN etch-stop layer over the top the TiN cap film.

FIG. 5 shows the isotropic deposition of TaN etch-stop layer 536 over the top the TiN cap film 435 which will be used to prevent removal of the TiN cap film during subsequent metal removal for threshold voltage tuning where additional TiN is used as a work function metal.

Figure 6:
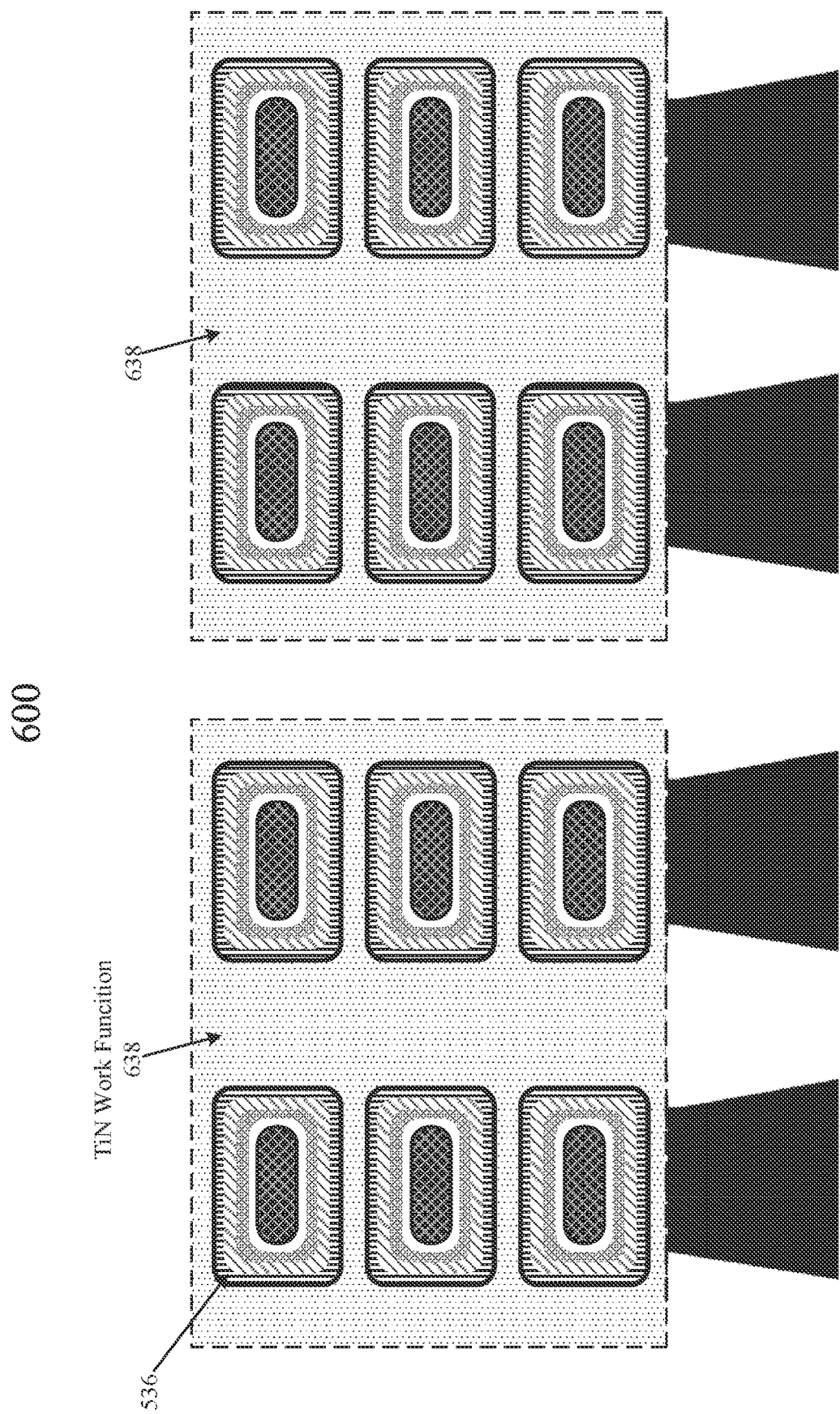
FIG. 6 depicts the isotropic deposition of TiN work function metal across the NMOS and PMOS gates.

FIG. 6 illustrates the isotropic deposition of a TiN work function metal 638 across NMOS and PMOS gates.

Figure 7:
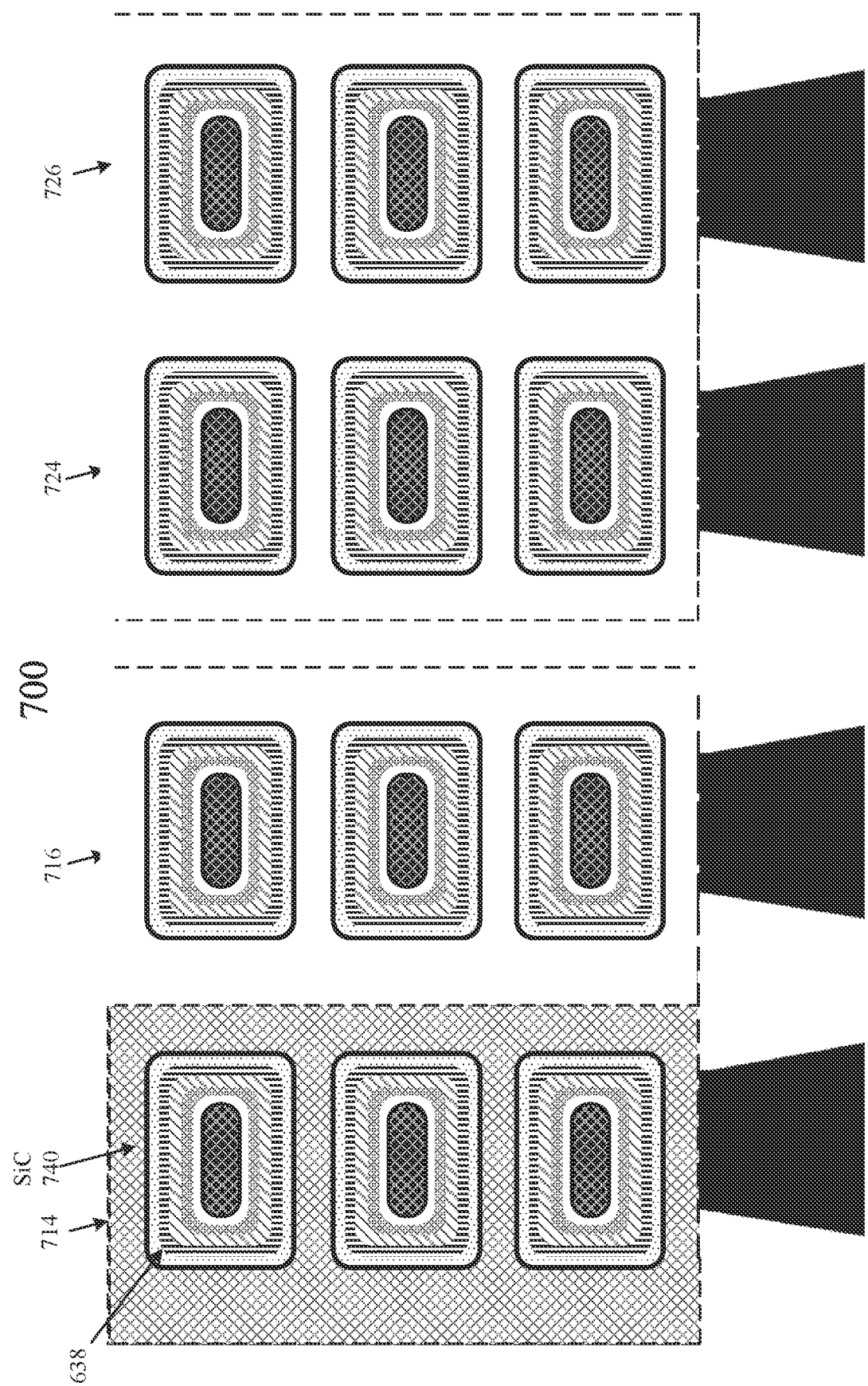
FIG. 7 shows patterning of a filling material.

FIG. 7 illustrates the patterning of a filling material 740 such as spin-on carbon (SOC) to effectively keep the high threshold voltage PMOS gate 714 "blocked" and the TiN work function metal for the low threshold voltage PMOS 724 and all NMOS gates (716, 726) is opened to be removed through wet-etch.

Figure 8:
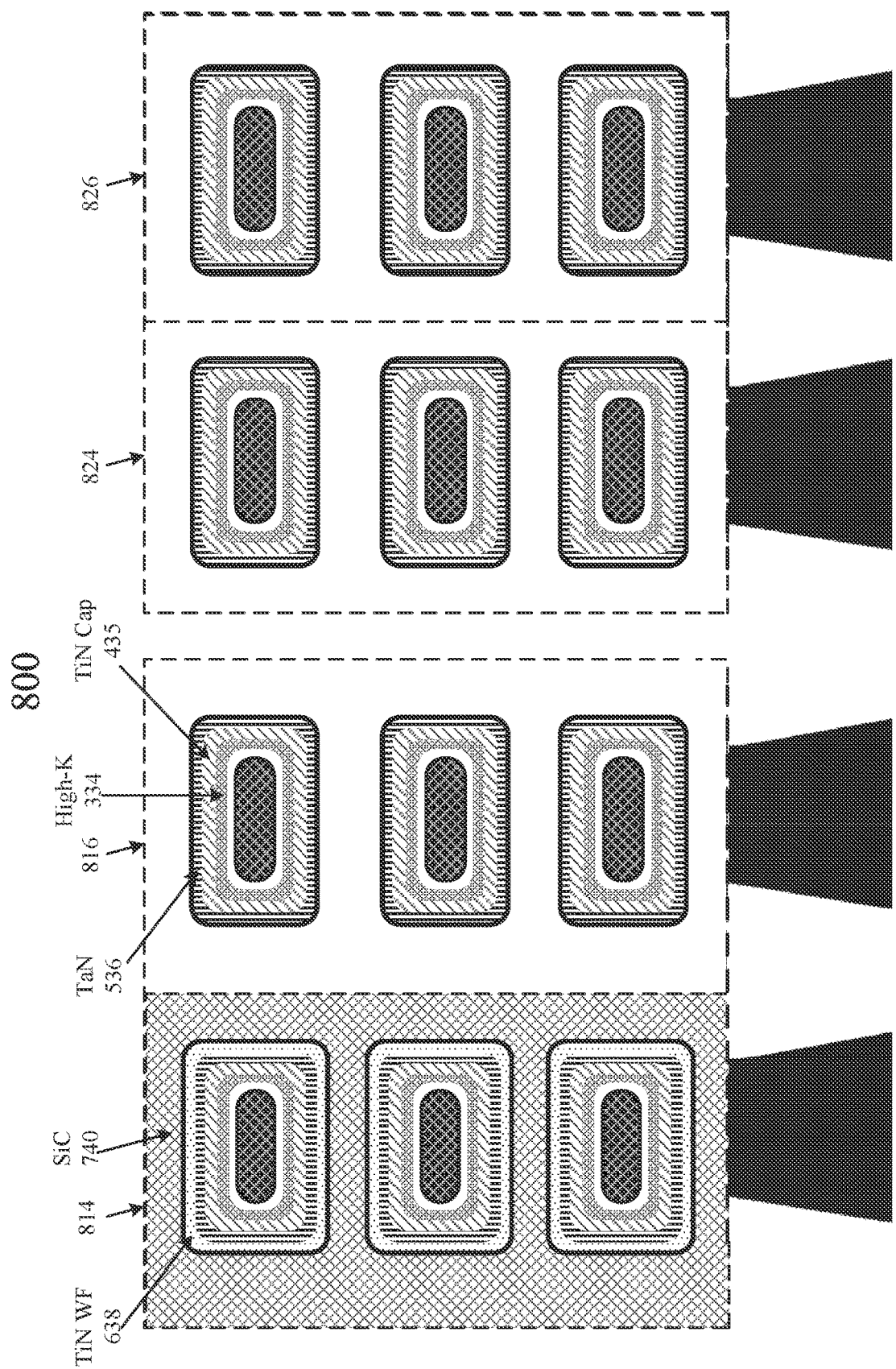
FIG. 8 shows wet etch removal of the TiN work function metal from the opened portions of the $V_t$ mask.

FIG. 8 illustrates the device after wet etch removal of the TiN work function metal 638 from the opened portions of the $V_t$ mask. The TaN layer 536 is an etch stop layer which prevents the removal of the TiN cap 435 over the top of the high-k film 334. In an alternative, after this step, the wet etch may then be changed to focus on the removal of the TaN 536 selective to TiN 435 in order to remove the etch stop layer as a means for reducing the total HKMG stack thickness. However, in this integration scheme, the TaN stop-layer is maintained as a means for reducing the number of $V_t$ tuning masks subsequent applied in the integration flow.

Figure 9:
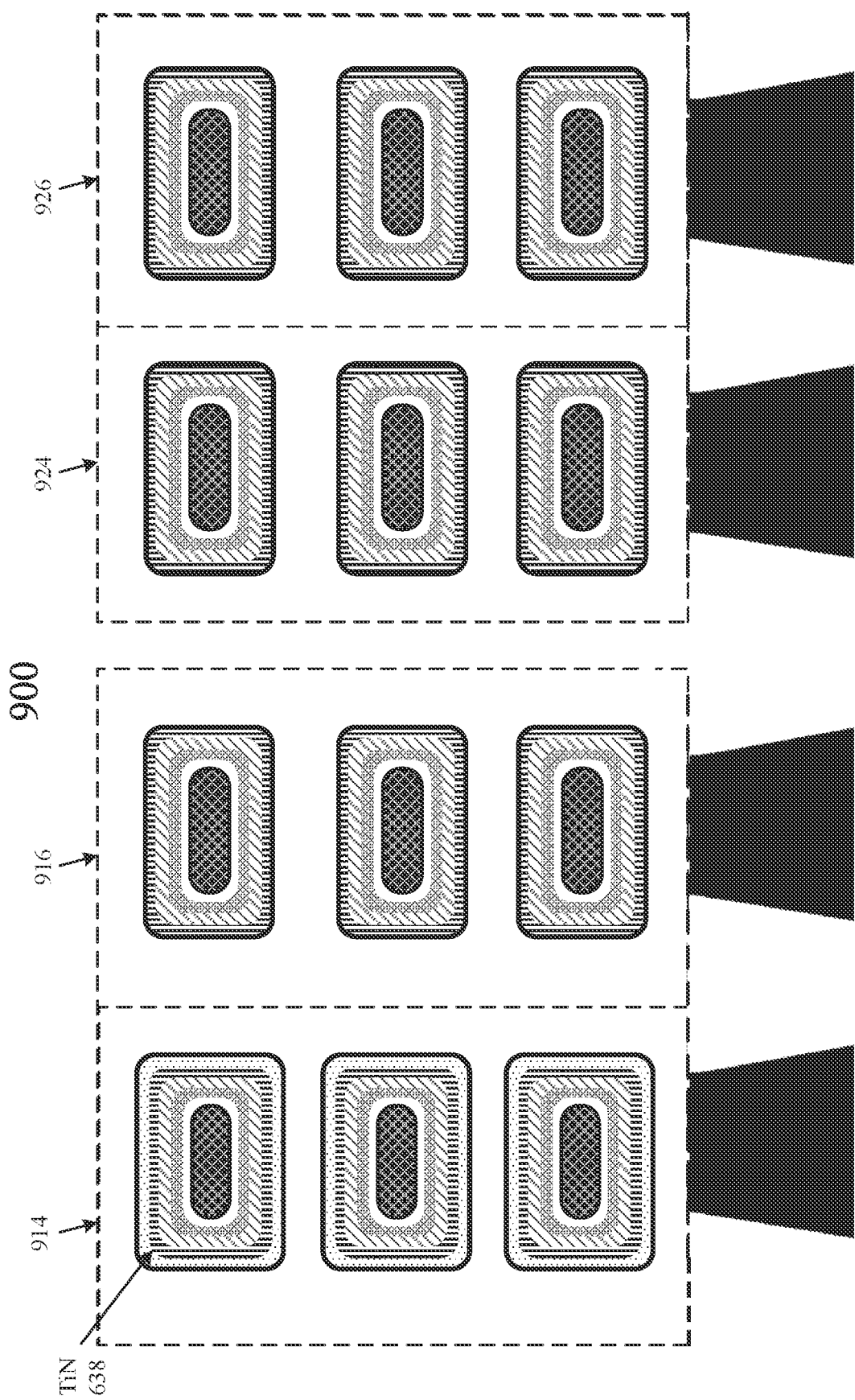
FIG. 9 shows the TiN work function metal which remains only within the high threshold voltage PMOS gate.

FIG. 9 depicts the high voltage PMOS gate 914 with the SOC filling material 740 removed, thus showing the TiN work function metal 638 remaining only within the high threshold voltage PMOS gate 914 and stripped everywhere else.

Figure 10:
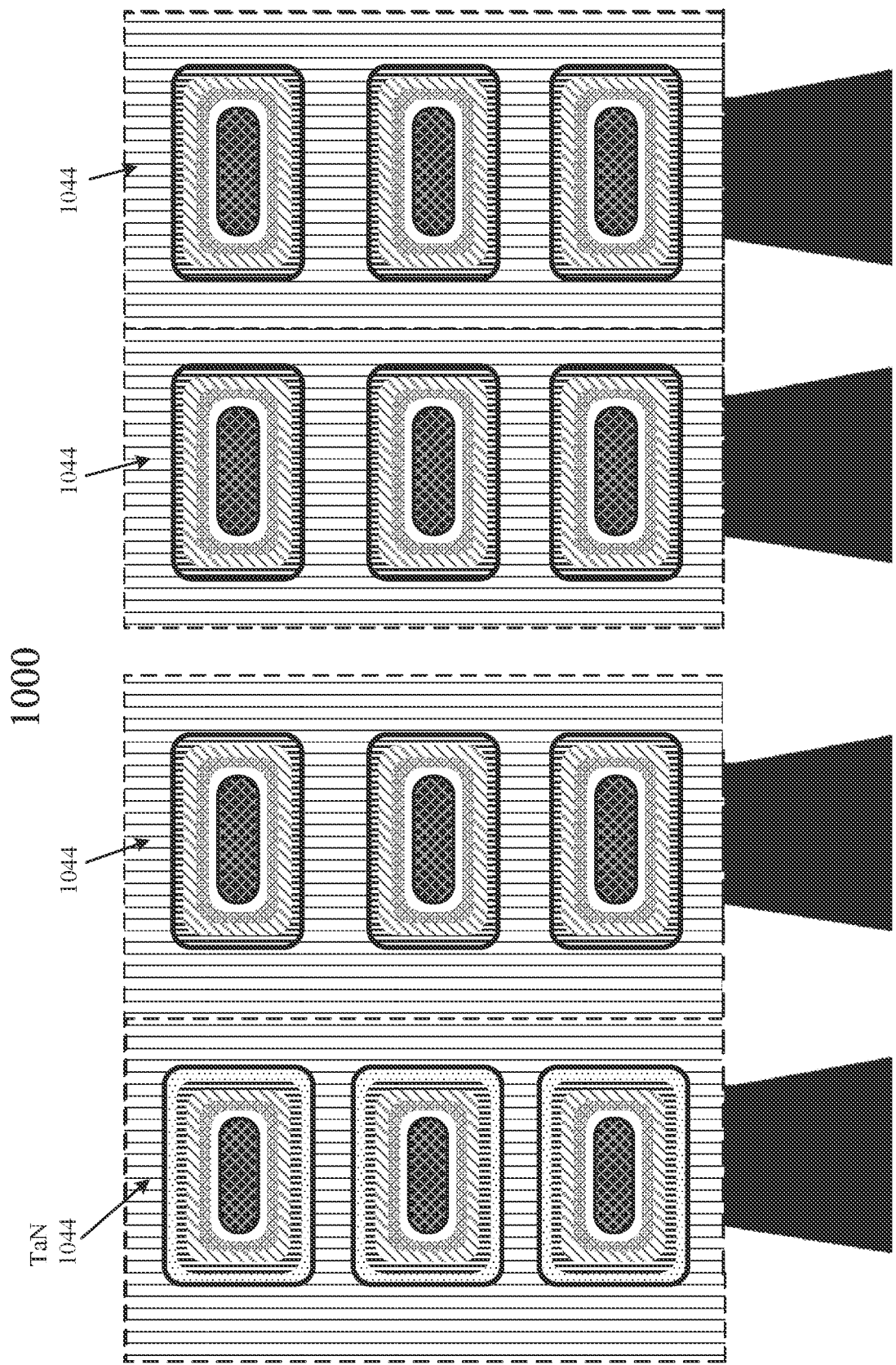
FIG. 10 depicts isotropic deposition of TaN over the top of both NMOS and PMOS gates.

FIG. 10 depicts the isotropic deposition of TaN 1044 over the top both NMOS and PMOS gates to provide etch-stop layer to protect the TiN work function metal of the high threshold voltage PMOS gate. Note that the deposition in the NMOS gates and low threshold voltage PMOS gates effectively increases the amount of TaN deposited over these gates. Also note that since these are isotropic depositions, either through atomic layer deposition or conformal chemical-vapor deposition, the deposition along the sidewall and bottom of the replacement gate trench mirrors what is being deposited over the actual channel.

Figure 11:
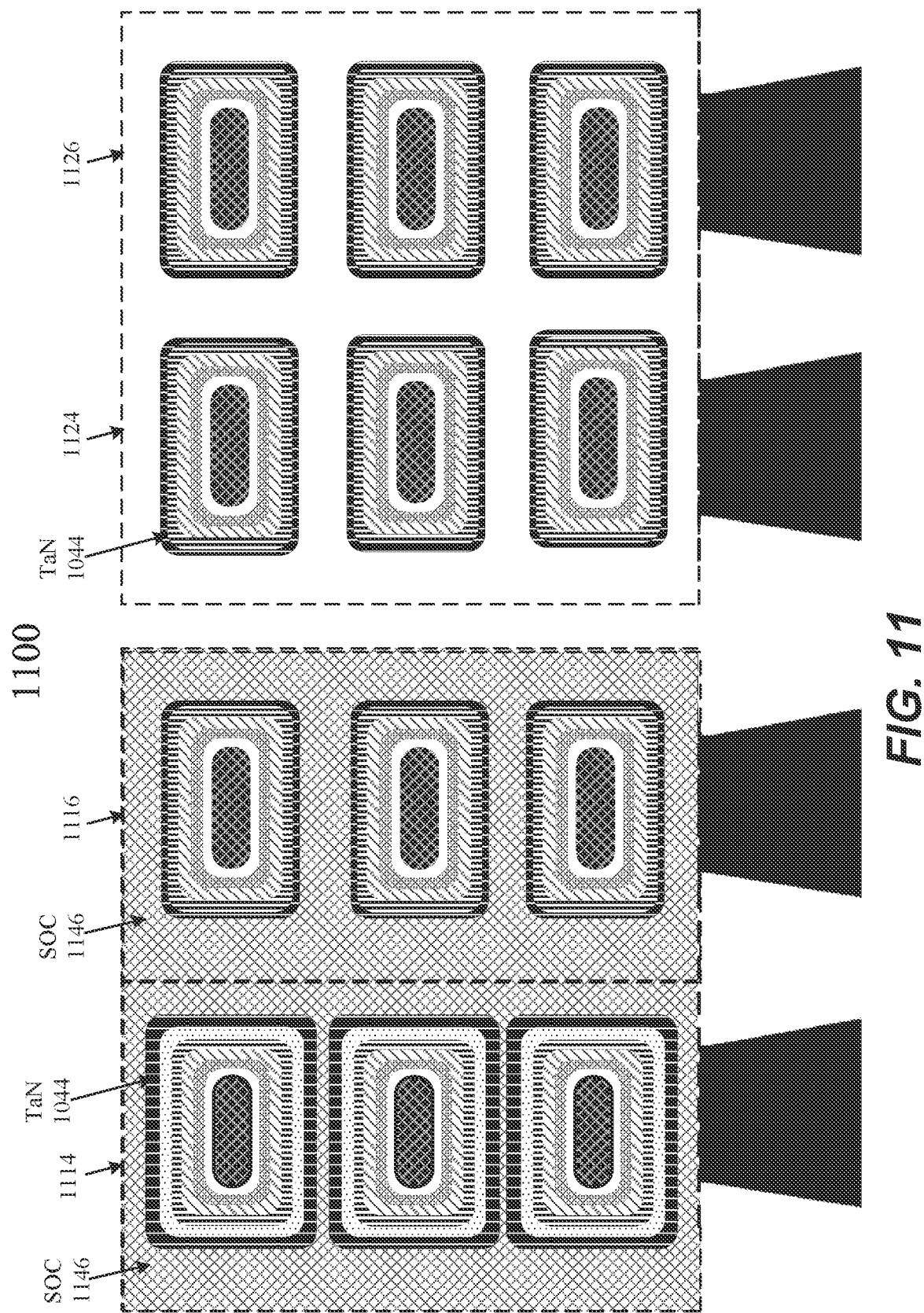
FIG. 11 shows patterning of a filling material.

FIG. 11 illustrates the selective patterning of a filling material such as spin-on carbon (SOC) 1146 to effectively keep the high threshold voltage PMOS 1114 and NMOS 1116 gates "blocked". The low threshold voltage PMOS 1124 and NMOS 1126 gates are opened for removal of the TaN etch stop layer metal 1044 through wet-etch.

Figure 12:
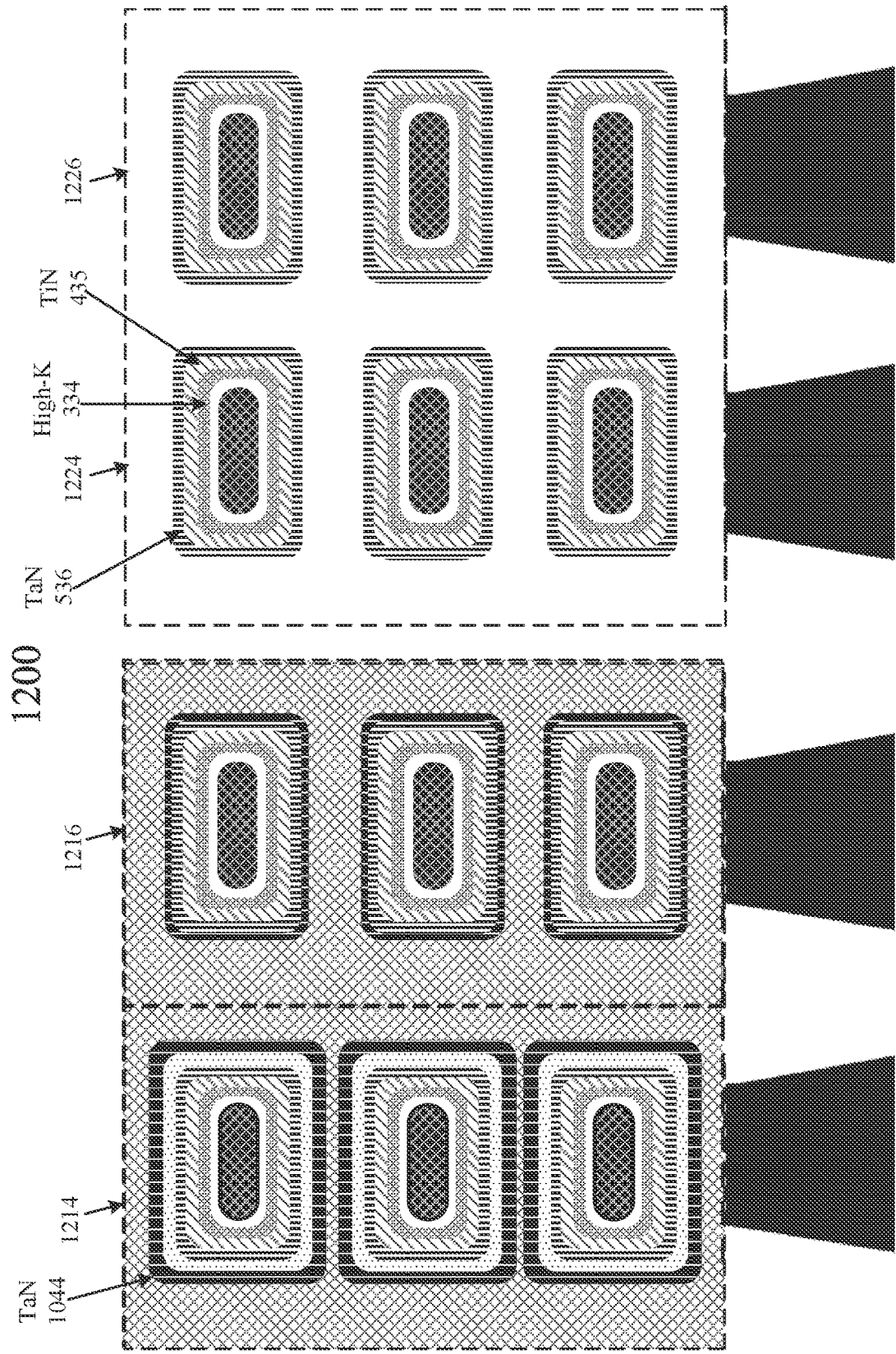
FIG. 12 depicts wet etching of the TaN etch stop layer selective to the TiN cap over the high-k film for the low threshold voltage NMOS and PMOS gates.

FIG. 12 depicts the wet etch of the TaN etch stop layer 1044 selective to the TiN cap 435 over the high-k film 334 for the low threshold voltage PMOS 1224 and NMOS 1226 gates.

Figure 13:
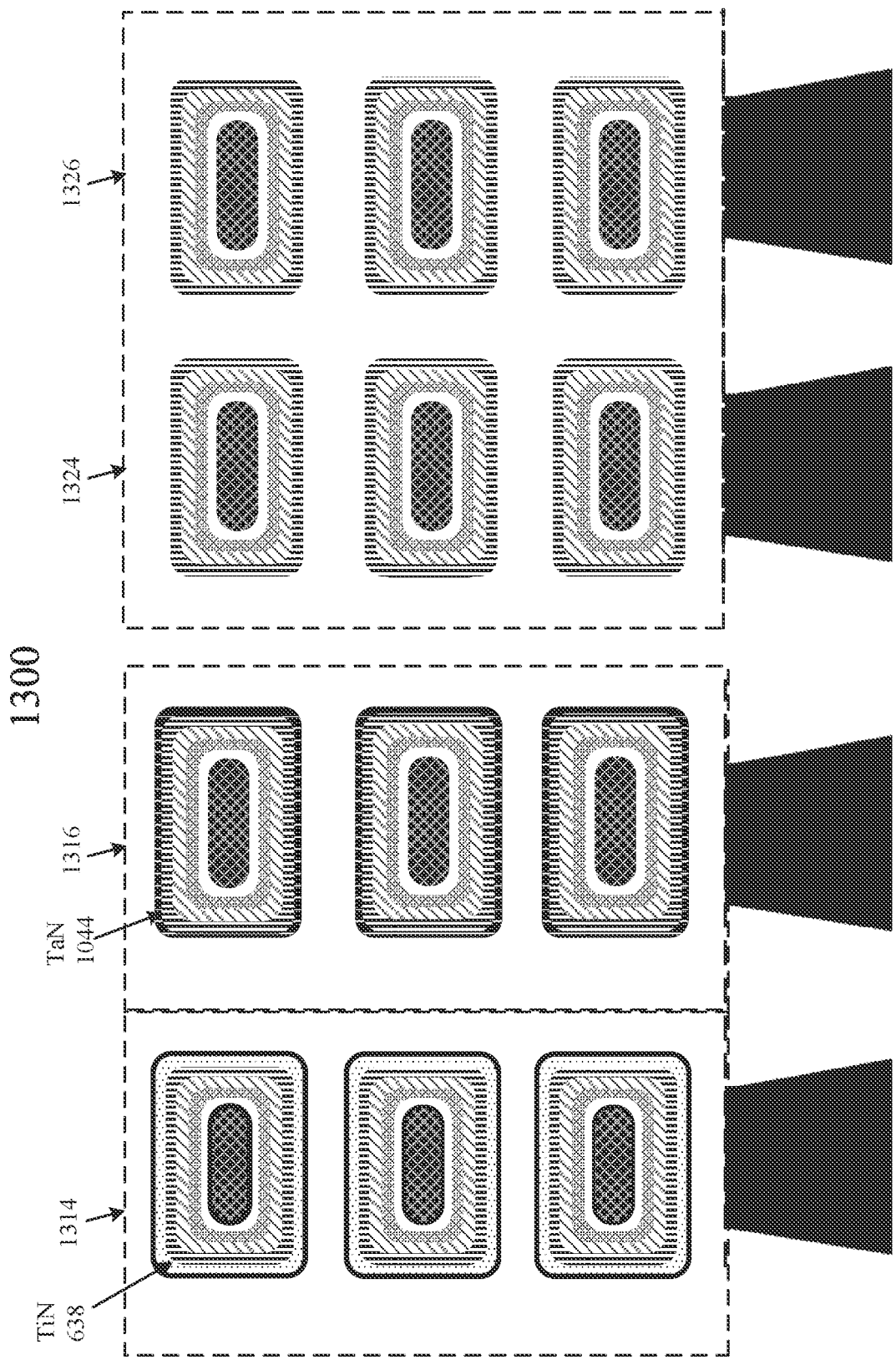
FIG. 13 shows removal of the filling material which reveals the TaN layer remaining for the high threshold voltage NMOS and PMOS gates.

FIG. 13 depicts the removal of the filling material 1146 which reveals the TiN work function material 638 for the high threshold voltage PMOS gate 1314 and the TaN 1044 remaining for the high threshold voltage NMOS gate 1316.

Figure 14:
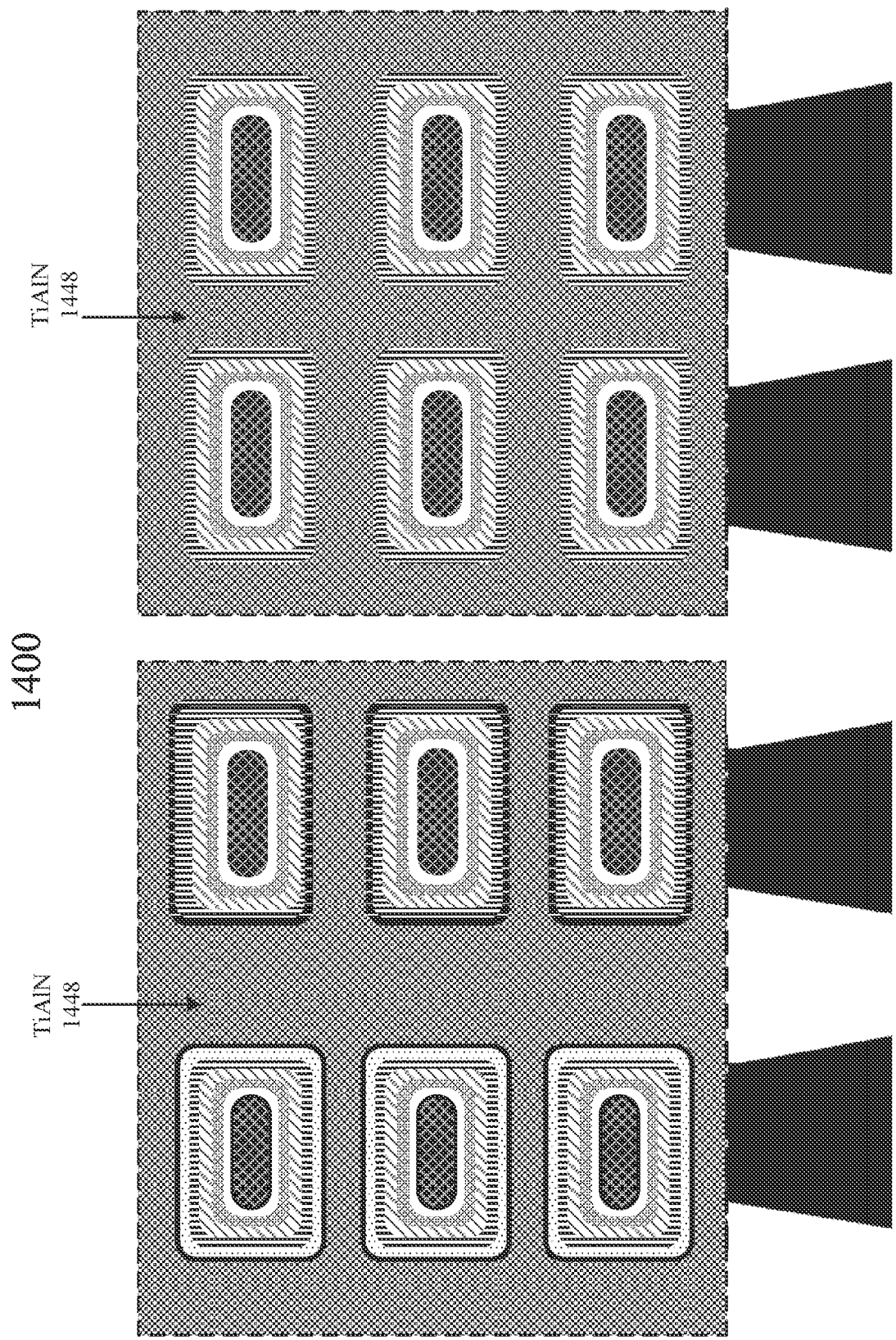
FIG. 14 depicts the isotropic deposition of NMOS work function metal over the top of the NMOS and PMOS gates.

FIG. 14 illustrates the isotropic deposition of NMOS work function metal 1448 (TiAlN shown here as an example) over the top of the NMOS and PMOS gates.

Figure 15:
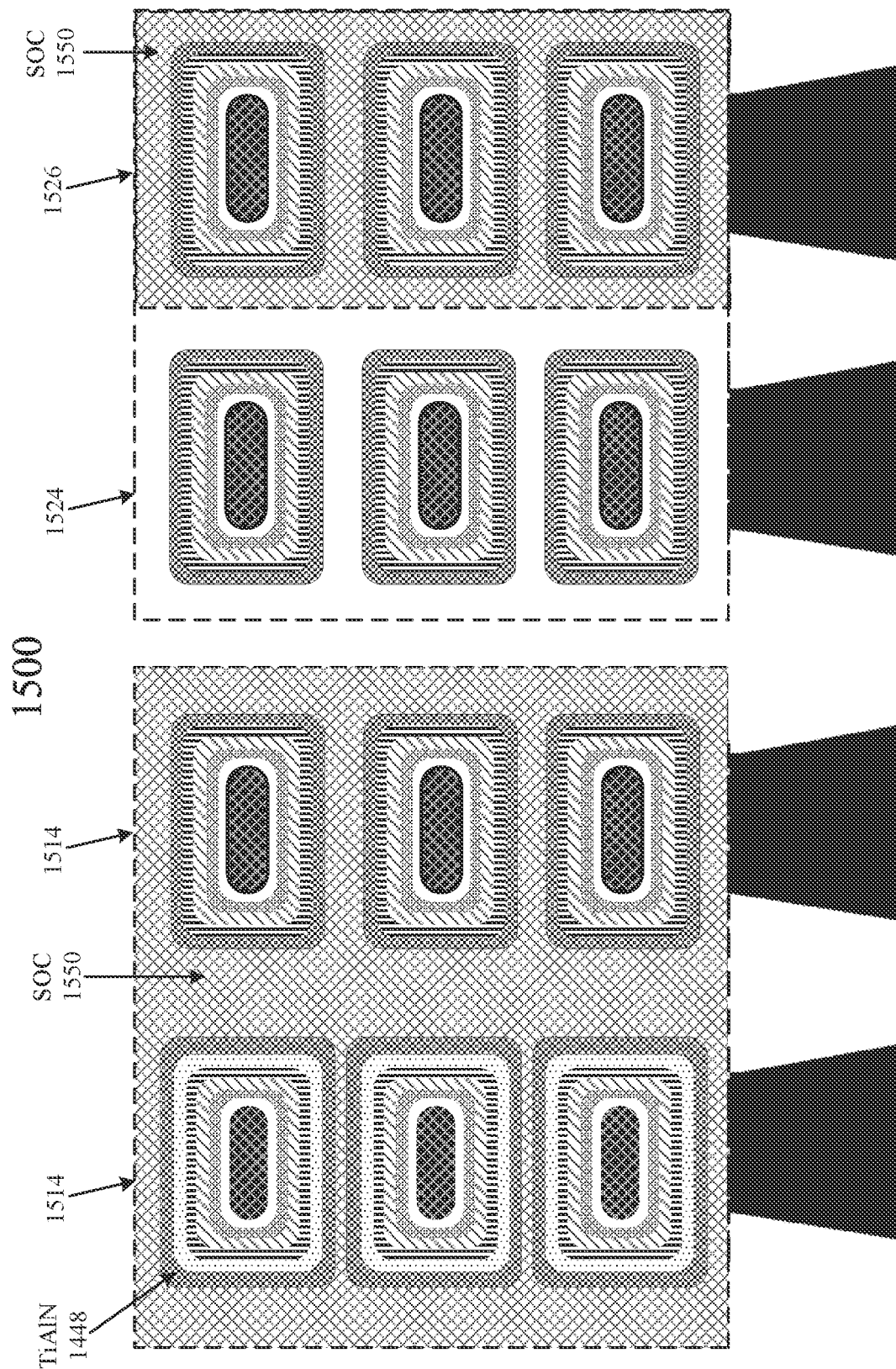
FIG. 15 illustrates patterning of a filling material.

FIG. 15 shows the patterning of a filling material such as spin-on carbon (SOC) 1550 to effectively keep the high threshold voltage PMOS 1514 and NMOS 1516 gates as well as the low threshold voltage NMOS 1526 "blocked". The low threshold voltage PMOS gate 1524 is opened for the NMOS work function metal 1448 (TiAlN assumed here) to be removed through wet etch.

Figure 16:
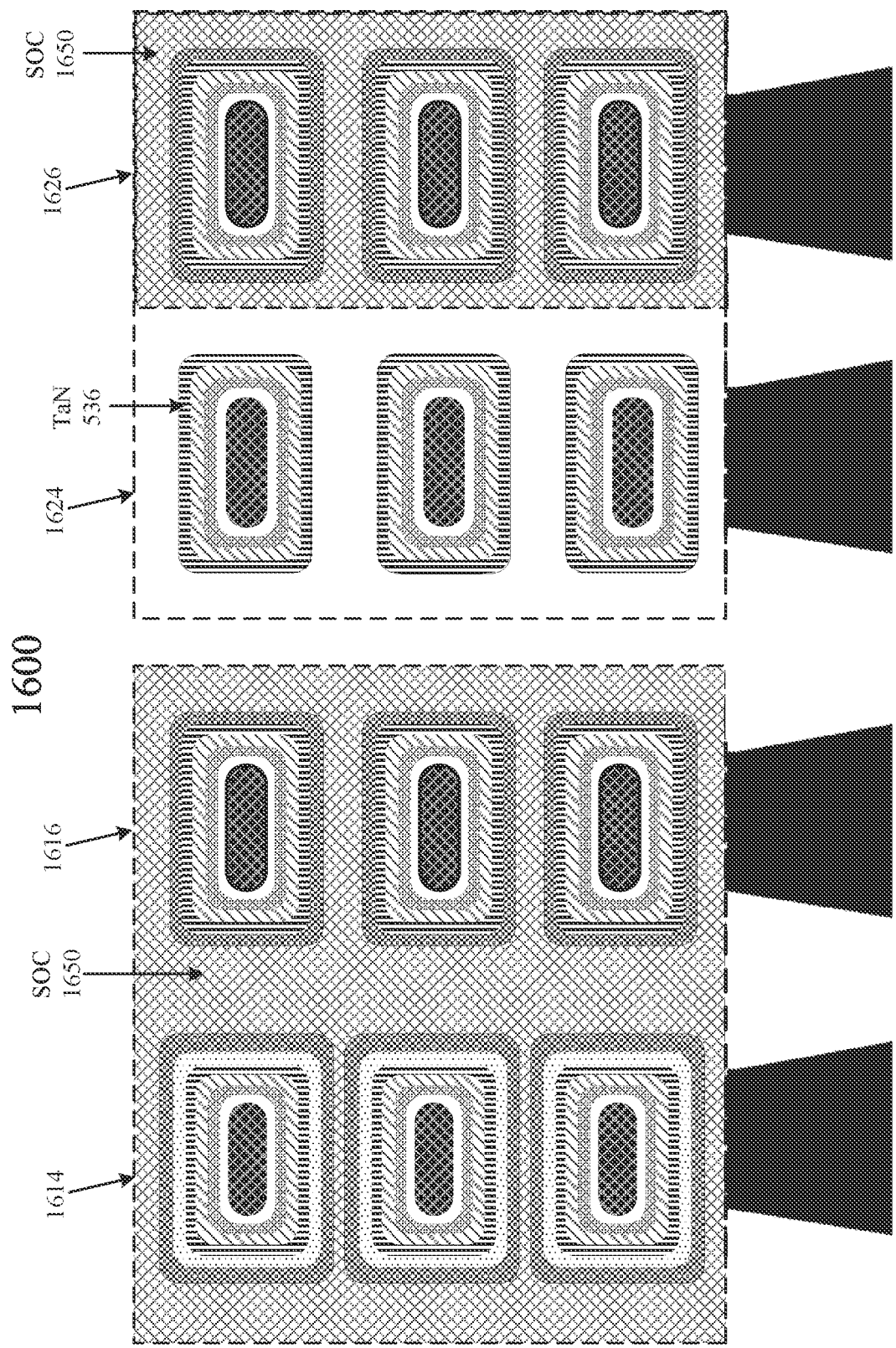
FIG. 16 illustrates a wet etch of the NMOS work function metal from the low-threshold voltage PMOS gate.

FIG. 16 shows a wet etch of the work function metal 1448 (TiAlN assumed in this case) from the low-threshold voltage PMOS gate 1624.

Figure 17:
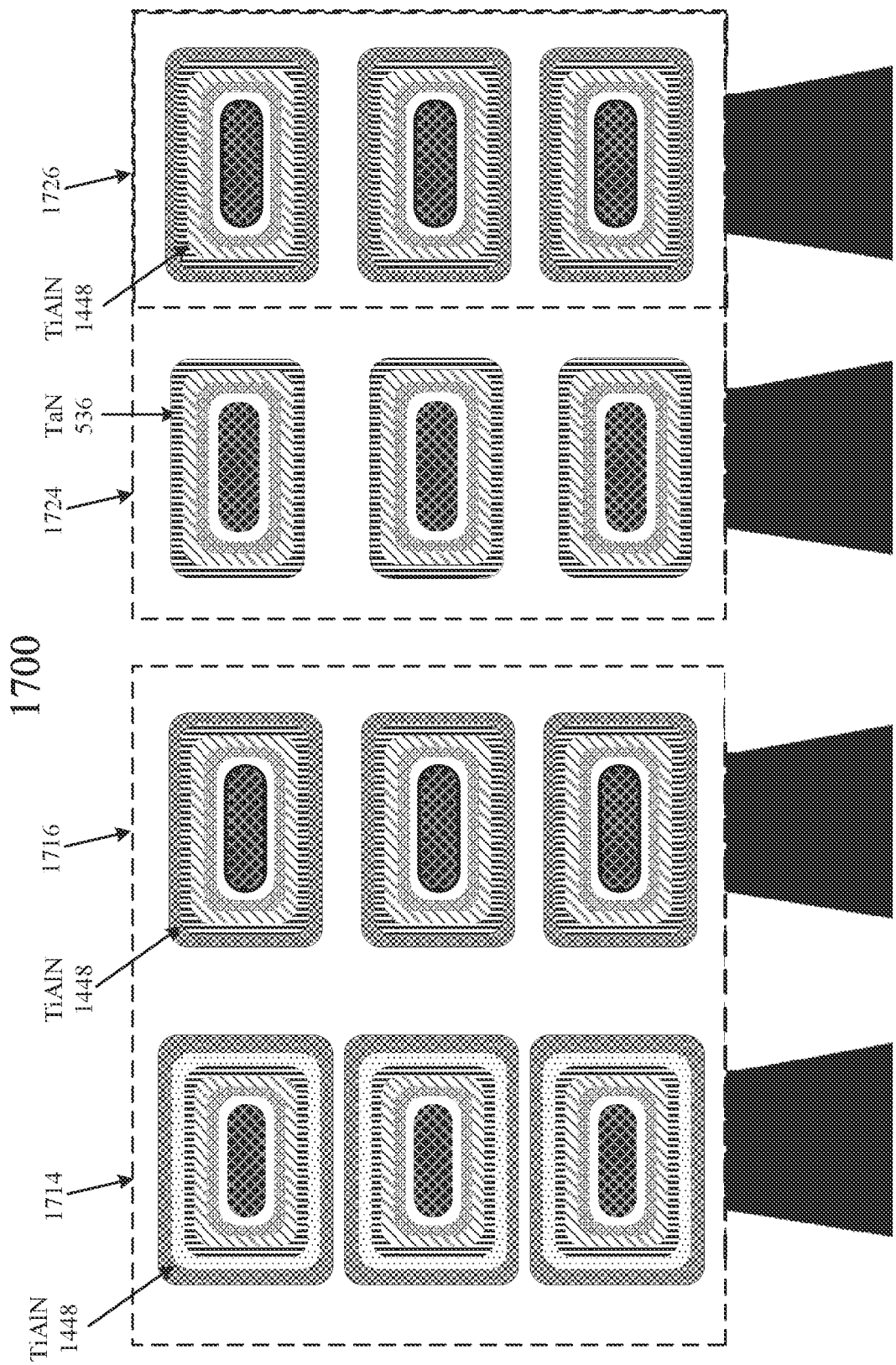
FIG. 17 shows removal of the spin-on-carbon patterning fill layer showing the NMOS work function metal being removed from the low threshold voltage PMOS gate while remaining on the other gates.

FIG. 17 illustrates the removal of the spin-on-carbon patterning fill layer 1650 showing the NMOS work function metal 1448 (TiAlN assumed here) has been removed from the low threshold voltage PMOS gate 1724 exposing the TaN layer 536 while remaining on the low threshold NMOS gate 1726 as well as both the high threshold voltage NMOS 1716 and PMOS 1714 gates.

Figure 18:
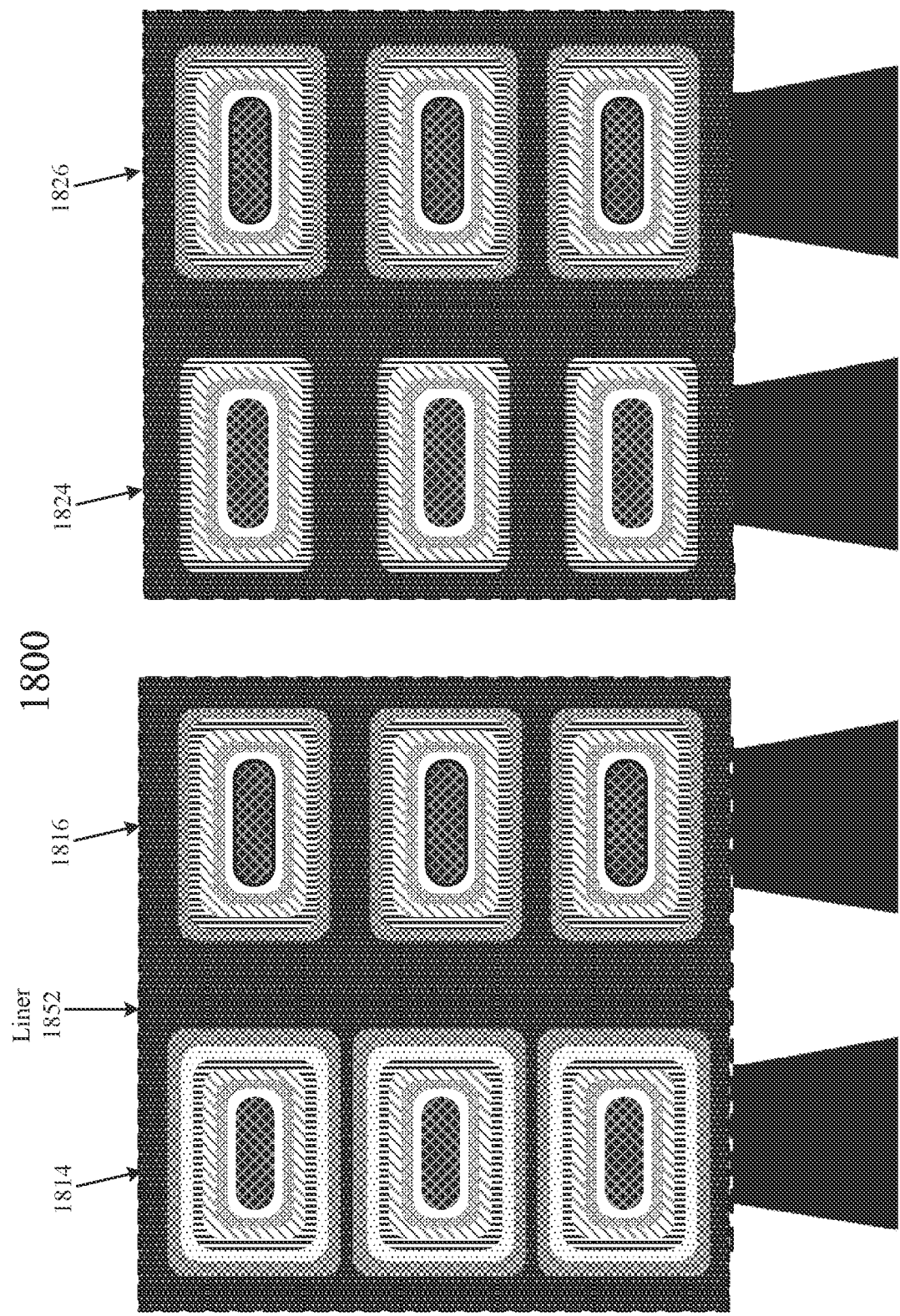
FIG. 18 depicts the isotropic deposition of a liner material prior to the deposition of the high conductance metal fill to complete the HKMG stack.

FIG. 18 show the isotropic deposition of a liner material 1852 prior to the deposition of the high conductance metal fill to complete the HKMG stack. The liner will deposit on the sidewalls of the trench as well as around the nanowire channels. The liner is very thin (on the order of 1 nm) so does not add appreciably to thickness of the trench walls and floor. Typically TiN or TaN is used as the liner materials for cases where the high conductance fill material such as tungsten or cobalt are used. Ruthenium may be used as the high conductance fill material, in which case a liner material may not be required, however extensive physical simulation would be necessary as ruthenium leans toward being a p-type metal.

Figure 19:
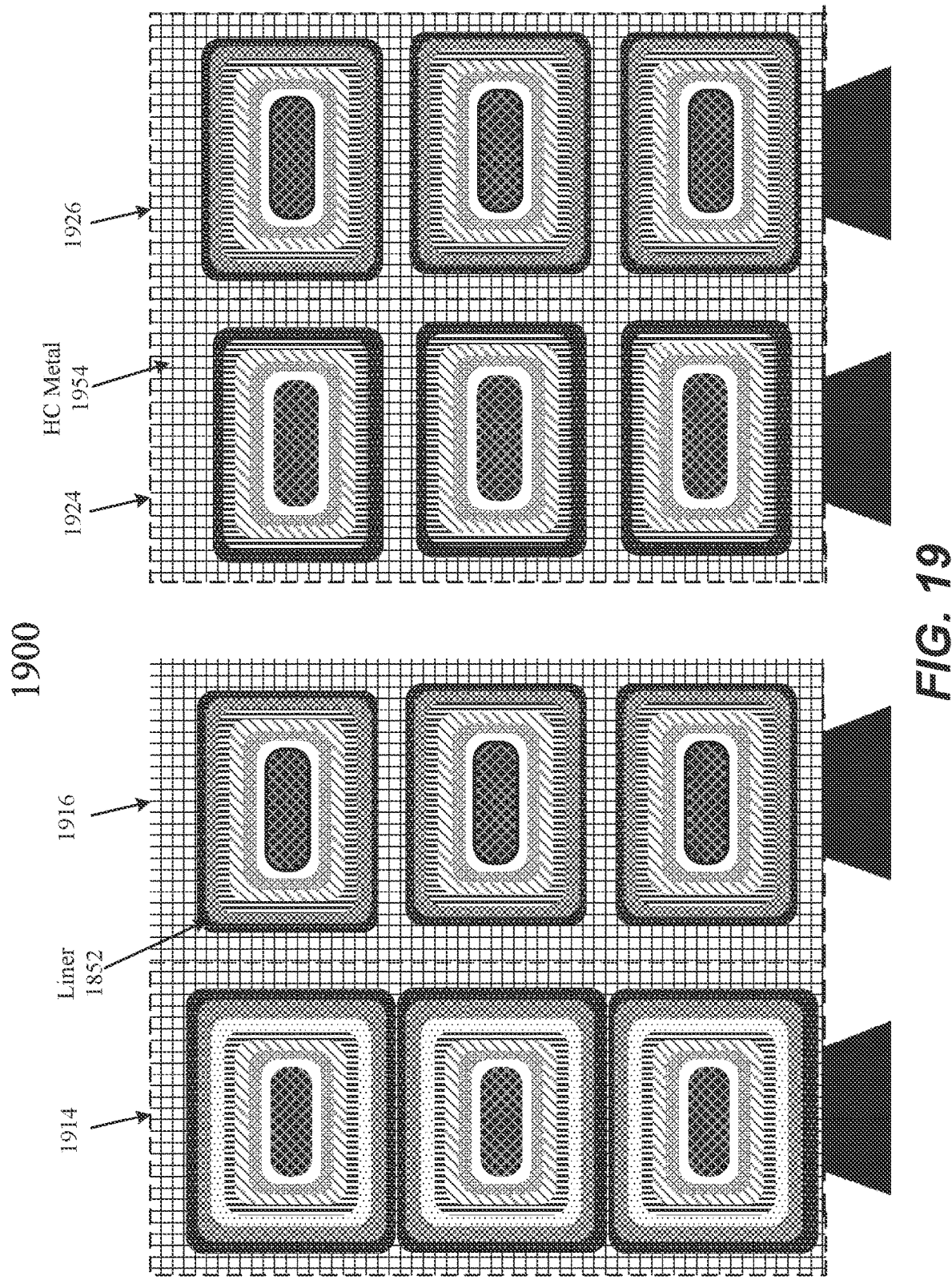
FIG. 19 illustrates filling of the high conductance metal material to complete the HKMG structure.

FIG. 19 depicts the filling of the high conductance (HC) metal material 1954 (tungsten assumed in this example) to complete the HKMG structure. The high conductance metal material will fill in all open spaces within the transistor (gate), thus will fill the sides of the trenches as well as the nanowires. Note that for the case of lateral nanosheets with the high threshold voltage condition, that the work function metals are starting to merge between adjacent nanosheets and the floor of the replacement gate trench. Although designed with conservative estimates of liners/stop-layers/work function thickness along with a final 15 nm vertical separation between stacked nanosheets, in practice merging is worse.

Figure 20:
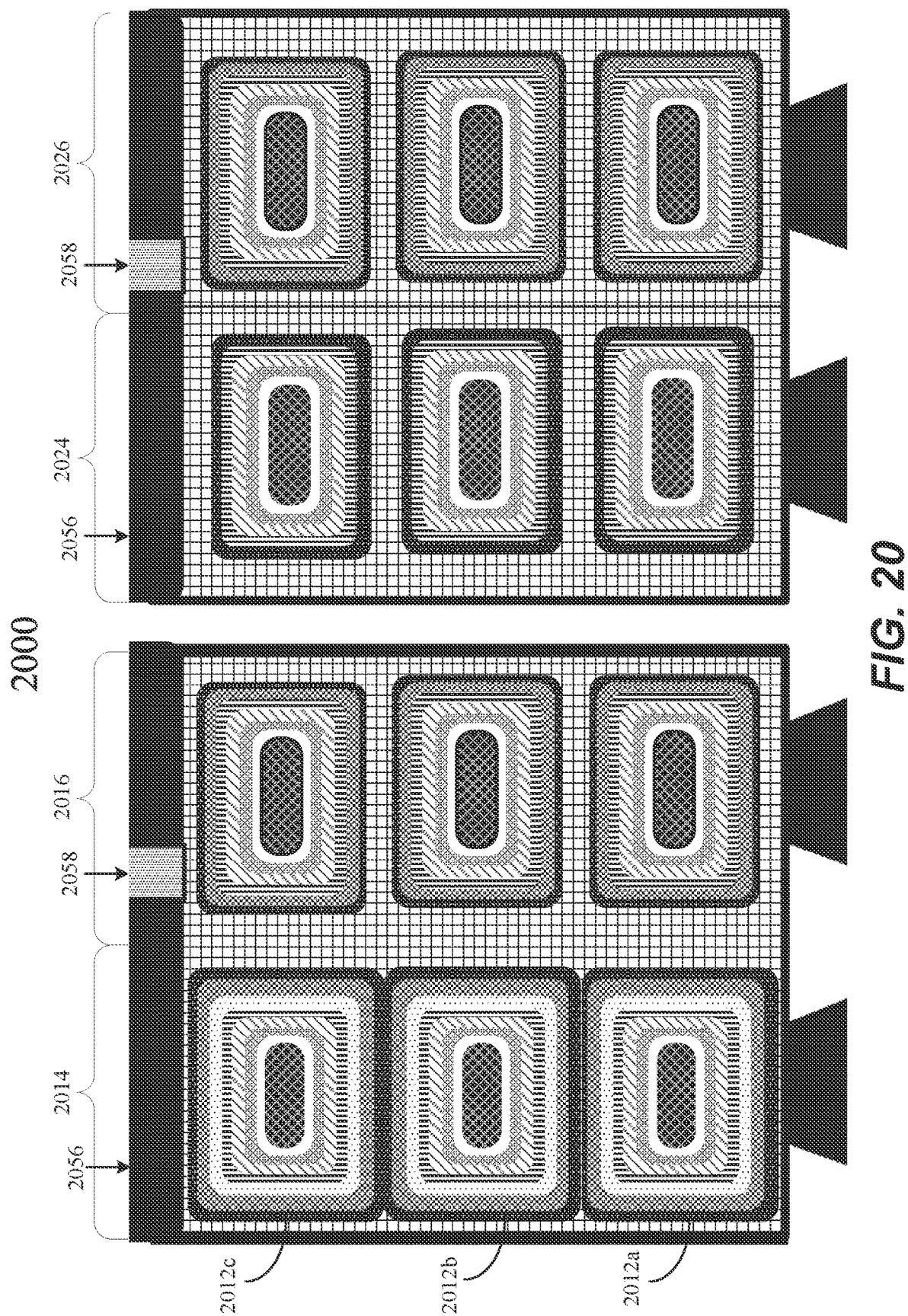
FIG. 20 illustrates recessing of the HKMG metal within the gate, formation of the SiN cap and formation of an input gate contact to the common gate.

FIG. 20 depicts the recess of the HKMG metal stack within the gate, formation of an SiN cap 2056 and subsequent formation of input gate contact 2058 to the common gate. The left two stacks show the high threshold voltage case for PMOS 2014 and NMOS 2016. The two right stacks show the low threshold voltage case for PMOS 2024 and NMOS 2026. Note that the nanowires (212 a, b, c, FIG. 2) of the high voltage PMOS stack 2014 have merged with each other and the bottom wall, which may cause the high voltage stack to fail.

The integration flow of the following steps includes some additional steps to the case of simple NMOS/PMOS work function metal stack formation: (a) removing polysilicon or amorphous silicon through a wet etch process within the replacement gate, (b) removing the chemical oxide protecting the FIN structures within the replacement gate, (c) formation of an interface silicon oxide layer over the cleaned FINs where the interface oxide can be around 8 to 12 Angstroms in thickness for core logic sections current state-of-the-art devices and can have a thickness well above 12 Angstroms for high-voltage portions of the chip such as the input and output portions (I/O) (d) deposition of a high-k (HK) dielectric material such as HfO over the interface layer through an atomic layer deposition process, where the thickness of the high-k film can vary from 10 Å to 20 Å in the core logic section, (e) deposition of a TiN capping layer over the HK film through atomic layer deposition or conformal CVD deposition, (f) deposition of an etch stop layer such as TaN through atomic-layer deposition or conformal CVD deposition, (g) deposition of polysilicon or amorphous silicon into the replacement gate through a chemical vapor deposition (CVD) or physical vapor deposition (PVD) process, (h) high temperature anneal to drive reliability for the HK film, (i) removal of the polysilicon or amorphous silicon fill from the replacement gate, (j) deposition of a p-type work function metal through atomic layer deposition or conformal CVD across both NMOS and PMOS gates. Such common p-type work function metals include TiN, (k) blocking of the NMOS and PMOS gates with a filling material such as spin-on-carbon (SOC), (l) patterning of a "blocking" mask that will open only the NMOS portions as well as the high-$V_t$ PMOS portions (additional step) of the replacement gate w % bile blocking the PMOS low-$V_t$ portion, (m) once the NMOS portion and low-$V_t$ PMOS portion (additional step) of the replacement gate is opened and the SOC material etched away from within only the NMOS portion and low-$V_t$ PMOS portion (additional step) of the replacement gate, the TiN is wet-etched where the underlying TaN etch stop layer (ESL) prevents any removal of the TiN cap deposited over the top the HK, optionally a second wet etch can be used to then selectively remove the TaN without etching the underlying TiN, (n) the SOC is then removed from the PMOS portion of the replacement gate to open up both NMOS and PMOS portions.

Additional steps include. (n+1) a second ESL such as TaN can then be deposited by atomic layer deposition or conformal CVD, (n+2) blocking the high threshold voltage portions of both NMOS and PMOS gates through filling with a material such as spin-on-carbon (SOC) and topographically patterning a blocking mask which opens only the low-$V_t$ portions of both NMOS and PMOS, (n+3) wet-etch removal of TaN selective to TiN in the opened regions of the $V_t$ tuning mask. Where there are multiple TaN films on top of one another, both TaN films are removed by the wet etch; for regions where there is TaN+TiN+TaN, only the uppermost TaN film is removed, (n+4) removal of the SOC and topographical patterning materials blocking the high-$V_t$ portions of both NMOS and PMOS gates.

The integration flow continues: (o) the n-type work function metal such as TiAl, TiAlN, or TiAlC is then deposited using atomic layer deposition or conformal CVD across both NMOS and PMOS gates, (p) a liner material such as TiN or TaN is then deposited within both NMOS and PMOS gates through atomic layer deposition or conformal CVD as a means for providing good barrier and adhesion for the subsequent deposition of a highly conductive filling metal such as Tungsten, Cobalt, Ruthenium, or even Aluminum or co-alloys of aluminum.

One concern with threshold voltage tuning using only work function metal stack and thickness in that the total HKMG stack thickness becomes excessive, and the integration process becomes relatively complex, even for just two $V_t$ conditions for NMOS and PMOS. Typically the TaN etch stop layer is needed to be on the order of at least 10-20 Angstroms so that for the PMOS high-$V_t$ condition, repeating TiN/TaN stacks adds a significant thickness to the HKMG stack. The larger work function metal stacks can ultimately limit the FIN pitch as well as indirectly limit the p/n junction and distance between FIN and any gate cuts. The FIN pitch typically runs in harmony with the critical metal pitch so any increase in the FIN pitch to accommodate a larger HKMG stack could result in larger standard cell size through increasing either the critical metal pitch to compensate or through adding an additional track in the critical metal layer. Typically the etch stop layers used have much lower conductivity compared to the final gate fill metal, so occupying much of the HKMG stack with added ESL will limit how much of the highly conductive fill metal can be used, thus significantly increasing gate resistance. Conversely another other option is to reduce the number of FINs in the design which will lower drive current and negatively impact device performance.

The second problem with this approach is that further increasing the number of available threshold voltages will add additional ESL layer depositions, so it is possible that for the highest threshold voltage conditions, that there will not exist adequate space to prevent merging of metals either between adjacent FIN structures or between FIN and cut structures within the gate. With the addition of more threshold voltage conditions, the integration becomes significantly more complex in terms of number of lithographic block steps which are required as well as the number of etch stop layer (ESL) films. In order to accommodate the increased number of films and the impact on gate resistance associated with the placement of lower conductance metals within the bulk of the opened transistor, atomic-layer direct etching of the work function metals must be considered to selectively etch certain crystal orientations of the work function metals with respect to the desired crystal structure. The risk of such processing is driven by the thickness variation, particularly when transitioning from a FINFET to a nanosheet device. In a nanosheet device, this etch must be very isotropic and be able to etch the bottom portions of the often very wide nanosheets relative to the top and side portions in order to control the threshold voltage.

The problem is not isolated to FINFET devices, but for nanowire and nano sheet and complimentary FET devices as well in which the transistors are stacked over top one another, either in a common gate fashion where NMOS and PMOS co-exist within the same common gate, or in a split-gate or stacked-transistor fashion in which NMOS and PMOS gate are stacked over top one another but separated through a dielectric film. For nanowire and nanosheet processes, the concern is not FIN-to-FIN merging of metals within the work function metal stack, but merging from one nanowire or nanosheet to the other in the vertical direction. Regardless for FINFET or nanowire/nanosheet, once there is any merging of a specific metal film between two adjacent channels or even where there is significant reduction in the available spacing between the adjacent channels, subsequent deposition of the next metal in the stack is prevented from being deposited as intended over the channel.

U.S. Patent Publication 2019/0172828 entitled "Semiconductor Apparatus Having Stacked Gates and Method of Manufacture Thereof." incorporated herein by reference in its entirety, describes a technique in which the work function metal stacks are deposited through atomic layer selective deposition or CVD selective deposition exposing the channel material which can either be silicon, silicon germanium (SiGe), or Germanium. The interface silicon oxide layer can then be created at the interface between the channel material and the high-k selectively deposited film. Subsequently, this process can be duplicated in which other metal containing films can then be selectively deposited over top the surface of other metal containing films or conducting materials. These additional selectively deposited films can include dipole forming species for the high-k film such as hafnium oxide or aluminum oxide, capping materials for the high-k film such as TiN, work function metals such as TiN, TiON, TiAl, TiAlN, TiC, and TiAlC, etch stop layers such as TaN, and even liner materials such as TiN and TaN to assist with the filling of high conductance fill metals such as aluminum, tungsten, cobalt, or ruthenium.

A self-assembled monolayer (SAM) is a one molecule thick layer of material that bonds to a surface in an ordered way as a result of physical or chemical forces during a deposition process. Silanes can form SAMs by solution or vapor phase deposition processes. Most commonly, chlorosilanes or alkoxysilanes are used. Once deposition occurs, a chemical (oxane or Si—O-M) bond forms with the surface rendering a permanent modification of the substrate.

In an aspect of the present disclosure, a self-assembled monolayer (SAM) is selectively attached to a dielectric film (such as the low-k spacer), which thereby forms an outer boundary of a typical replacement gate after the polysilicon or amorphous silicon has been pulled from the replacement gate. With the self-assembled monolayer preventing deposition along the sidewall of the opened replacement gate trench, a metal oxide high-k film such as hafnium oxide can be deposited selectively around the channel material.

The application of the selective deposition provides several benefits and features. Processes provide a mechanism for forming a "split gate" for a complimentary FET (CFET) device, an architecture in which NMOS and PMOS devices within a complimentary device are stacked laterally or vertically on top of one another as opposed to side-by-side as is done for conventional CMOS devices. Gate resistance reduction is achieved through removal of the liner, barrier, etch stop layer, and work function metal depositions along the sidewall of the replacement gate trench through the selective deposition of these materials only along the channel and having this "freed" or removed metal volume then be occupied with higher conductance metals such as tungsten, aluminum, cobalt, or ruthenium. Features include contacted poly pitch (CPP) reduction, or gate pitch reduction in which the selective deposition allows for a smaller Lg (gate length) as no work function metals, liners, barriers, or etch stop layers are deposited at the interface between the replacement gate inner sidewall and the terminus of the gate channel within the gate structure, thereby allowing for a reduction of the physical replacement gate size. A benefit includes reduction of FET capacitance in which a dielectric-on-dielectric selective deposition of a low-k material such as silicon oxide, SiOCH, SiCN, SiOCN, or SiOC can be done on the sidewall of the replacement gate trench, thus increasing the size of the gate spacer without changing the size of the physical gate, or coupled with the conductor-on-conductor selective deposition process, without changing the actual gate length (Lg). A more detailed description of these techniques can be found within the referenced disclosure(s).

Aspects of the present disclosure include a process in which the threshold voltage ($V_t$) of a channel can be adjusted through selective deposition processes. Such a process can be adopted across FINFET, nanowire/nanosheet, complimentary FET and vertical FET devices. Nanowire and nanosheet can both be considered a "nano-channel" or gate-all-around channel, that is, a channel that has a gate stack around an entire cross section of the channel. The channel cross section can be circular, square, rectangular, rounded edges, et cetera. Embodiments use a nanosheet device as the demonstration method but this is non-limiting and can be applied to additional device architectures and designs and any nano-channel.

Embodiments include methods of fabrication of semiconductor devices and integration processes.

In one embodiment, the threshold voltage(s) for state-of-the-art CMOS devices are controlled through a high-k metal gate (HKMG) stack for each intended threshold voltage condition for PMOS and NMOS transistors. Reliance on channel doping is not desired for current state-of-the-art devices due the decreasing size of the channels. The HKMG stack can herein can include several components or layers. These layers can include. (a) interface oxide layers, (b) high-k dielectric films with in-situ dipole forming materials, (c) capping layers. (d) separate dipole forming layers over the high-k dielectric, (d) etch-stop layers, (e) NMOS and PMOS work function metals, (f) liner materials, and (g) high conductance metal fills.

In another embodiment, thickness variation is achieved by both adjusting the thickness of the work function metal and incorporating a metal stack containing a work function metal of a specific thickness with the introduction of a second metal over top (with the latter approach commonly used for setting higher threshold voltages for PMOS transistors).

Thickness variability itself can cause significant threshold voltage shifts, which is why the conventional method for setting unique work function thicknesses for threshold voltage tuning is done through an "additive and subtractive" process in which a work function is deposited through an atomic layer deposition or very controlled chemical vapor deposition process, some type of etch-stop layer subsequently deposited, another metal layer deposited over the top the etch stop layer, and the second metal film removed from the intended lower threshold voltage condition.

Aspects of the present disclosure, however, integrate selective deposition atomic layer depositions or selective deposition chemical vapor deposition processes in an "additive" method in which a set work function metal thickness can be applied across all threshold voltage conditions, and additional work function metal can be deposited on higher threshold voltage conditions through a common lithographic block process. Accordingly, etch stop layers are not needed.

Moreover, the selective deposition method for threshold voltage adjustment can enable a significant number of different threshold voltages to be incorporated into a CMOS design, even with state-of-the-art dimensions. This can be achieved through the selective deposition processes described herein, or can be done through creating a block mask to open each NMOS and PMOS for threshold voltage conditions one at a time and grow either part or the entire HKMG stack for each threshold voltage condition at a single time on a single processing tool. Once one threshold voltage "HKMG stack" is completed, the lithographic blocking material can be removed and then the process repeated where a new block mask is patterned to open a next threshold voltage condition.

Removal of the etch stop layers in the additive and subtractive method as described herein for threshold voltage tuning has several benefits and features. Low conductance films from the HKMG stack can be replaced with high conductance metal fill such as with tungsten, aluminum, cobalt, or ruthenium. The total number of films needed to wrap around the gate channel is therefore reduced. For device performance, it is desirable to have the nanowires/nanosheets be as closely packed as possible. However, this relatively dense packing is often limited by the number of metal films wrapped around the channels such that at some point the metals from a closely packed deposition will begin to merge between two adjacent overlapping nanowires/nanosheets and impact transistor performance. The addition of multiple threshold voltages would thus be greatly limited in such a "additive and subtractive" approach since the higher threshold voltage conditions would contain multiple etch stop layers in the stack. It is possible to adopt a subsequent etch-stop layer removal step such as a selective wet-etch in the conventional process, but the additional removal step would further increase process complexity and would also require assurance that the selectively would be great enough as to not etch any of the capping or work function metals in the process.

Another benefit is a method to reduce the overall HKMG stack thickness while increasing the number of available threshold voltages. This enables a lateral pitch of the nanowires and nanosheets to be decreased which can provide significant transistor performance benefit. Another benefit is a way to reduce any potential of merging metals before the final high conductance metal fill within higher threshold voltage conditions. This provides better electrostatic control of the individual channels.

Another aspect of the present disclosure provides an integration process that reduces a total number of lithographic masking steps used. A common work function thickness for low and higher threshold voltages can be deposited at one time, and subsequently different threshold voltage conditions opened to perform additional selective deposition thus making the selective deposition method "additive" only. Additional lithography masking steps can be minimized by allowing PMOS threshold voltage to be accomplished through the addition of NMOS work function material over the top the NMOS work function metal. The figures below illustrate that the removal of the subtractive etch steps can have significant step sequence savings.

Step sequence savings result from bypassing the existing "additive and subtractive" methodology of employing depositions done on an atomic layer deposition or chemical vapor deposition tool for work function metal, etch-stop-layer deposition, and second work function metal deposition followed by removal from a corresponding tool and transport to a wet etch tool for the removal of the second work function metal from the low threshold voltage condition, where this sequence is repeated for each increase in the number of threshold voltage conditions. For the selective deposition processes of the present disclosure, all depositions within a common threshold voltage can be done sequentially within the same deposition tool.

Because work function thickness herein can be controlled with great accuracy in a selective deposition process and controlled to atomic layer deposition (ALD)-like precision, this method of setting threshold voltages not only provides a significant increase in the available number of threshold voltages which can be used while keeping a consistent or lower HKMG stack thickness around the channels, this method also provides for finer increments in threshold voltage now capable within designs herein.

The features and benefits described are based on two NMOS and two PMOS threshold voltage conditions. Accordingly, benefits of techniques herein are amplified for cases where the threshold voltage conditions exceed two for NMOS and PMOS. Thus, multiple threshold voltages can be realized for each of NMOS and PMOS. The application of the threshold voltage conditions may be applied to only one stack of channels, to two stacks of channels, to three stacks of channels or to four stacks of channels, such as the high voltage PMOS and NMOS channels and low voltage PMOS and NMOS channels of FIG. 1. The selective threshold voltage techniques of the present disclosure are not limited to one, two, three or four stacks of channels and may be applied to a plurality of channels as needed.

An example embodiment is shown below. For convenience in description, the embodiment is a single example to keep the overall mask count the same number as for the current state-of-the-art process, but showing the complexity decrease and total HKMG stack thickness decrease utilizing the selective deposition method. As can be appreciated, there are many variations possible with targeted masking and depositions.

In order to overcome the problem of the merging thicknesses, selective deposition is used to bypass some of the etch stop layers. For convenience in description, the embodiment is a single example to keep the overall mask count the same number as for the current state-of-the-art process previously described, but showing the complexity decrease and total HKMG stack thickness decrease utilizing the selective deposition method of the present disclosure. As can be appreciated, there are many variations possible with targeted masking and depositions.

Figure 21:
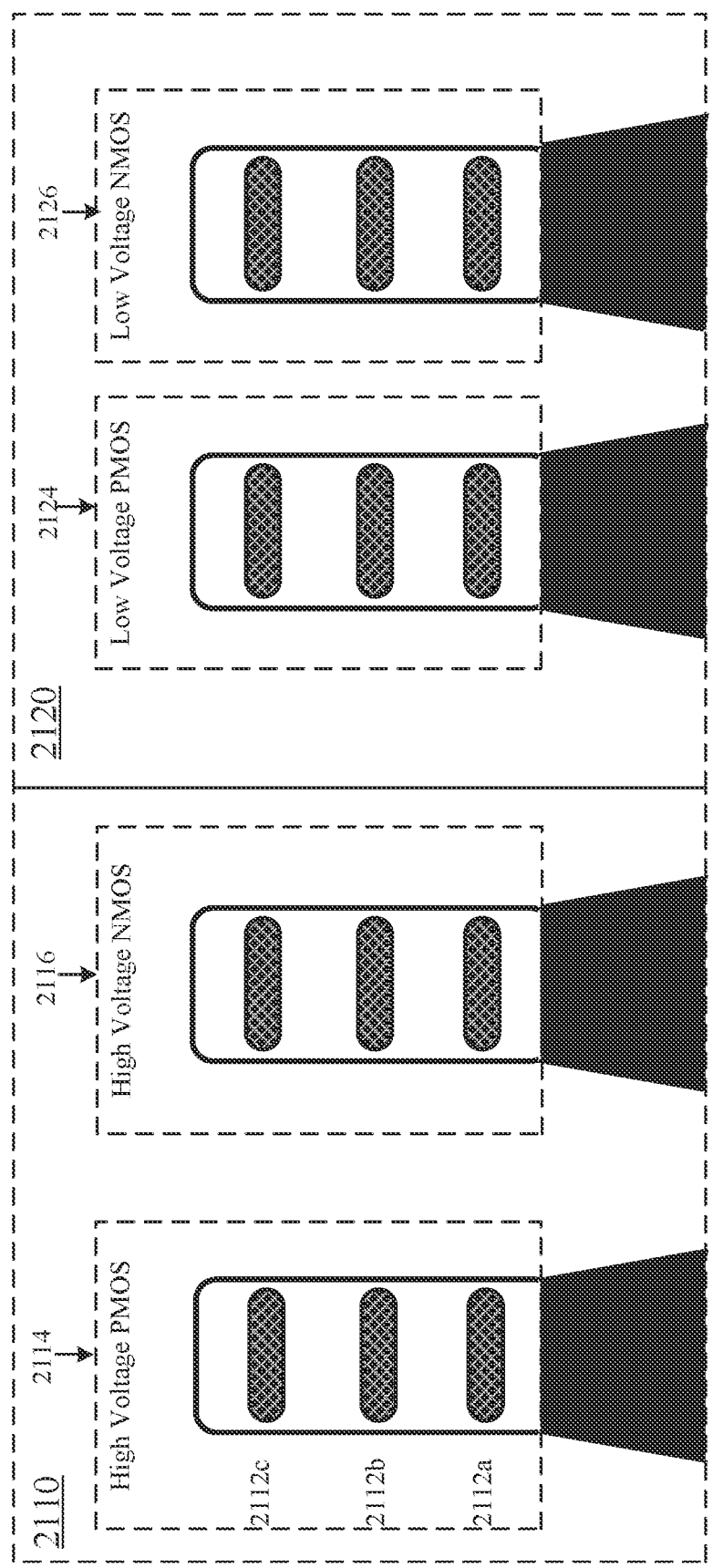
FIG. 21 is a cross-section taken through the common gate following nanosheet release for high threshold voltage condition (left) and low threshold voltage condition (right).

FIG. 21 is a cross-section taken through the common gate following nanosheet release for high threshold voltage condition 2110 and low threshold voltage condition 2120. Each common gate is composed of a PMOS gate (2114, 2124) on the left and a NMOS stack (2116, 2126) on the right.

Figure 22:
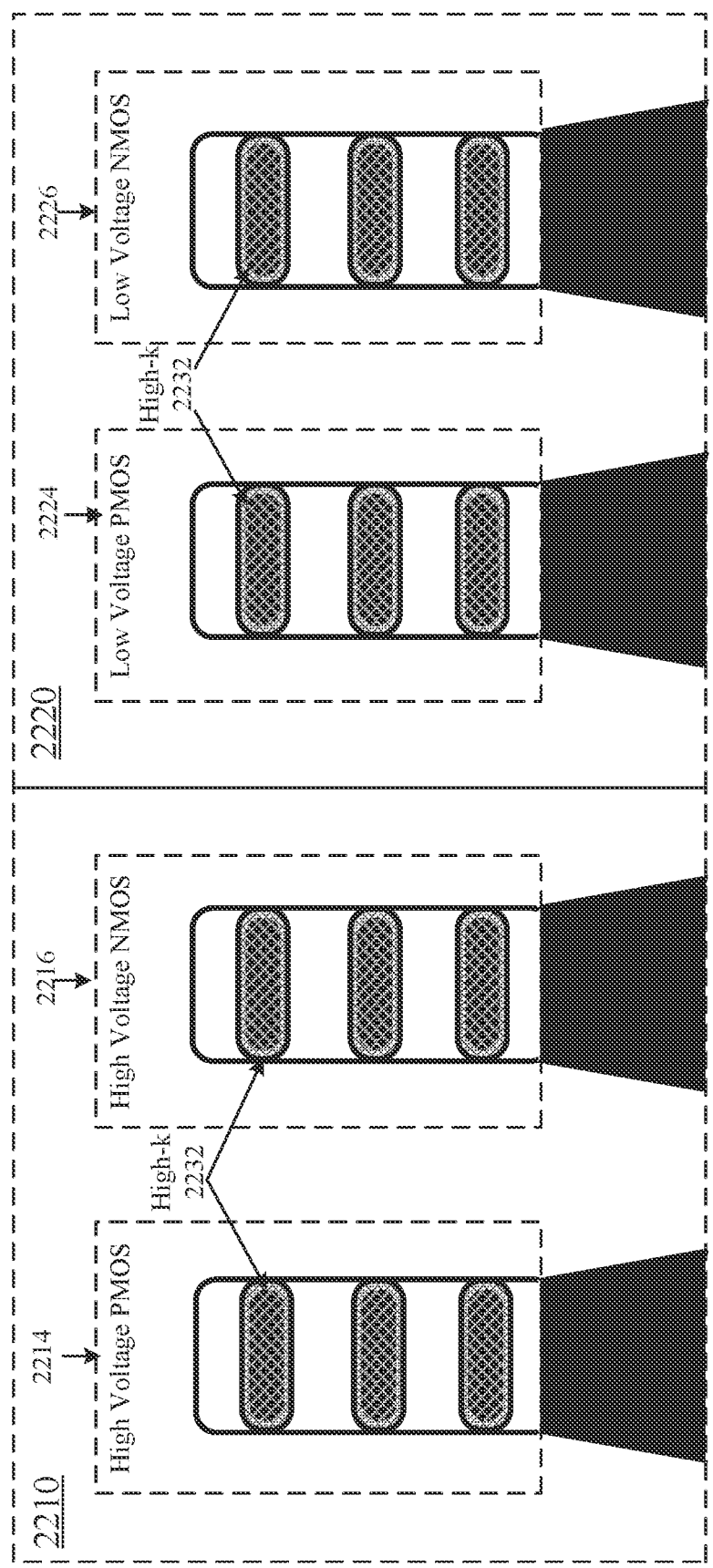
FIG. 22 shows selective deposition of high-k dielectric directly over the exposed nanosheet or nanowire within the replacement gate trench.

FIG. 22 shows the selective deposition of high-k dielectric 2232 (hafnium oxide assumed in this case) directly over the exposed nanosheet or nanowire within the replacement gate trench. The interface silicon oxide layer can be grown at the interface between the hafnium oxide and the nanowire, nanosheet structure and the high-k film can also be in-situ doped with a dipole forming species.

Figure 23:
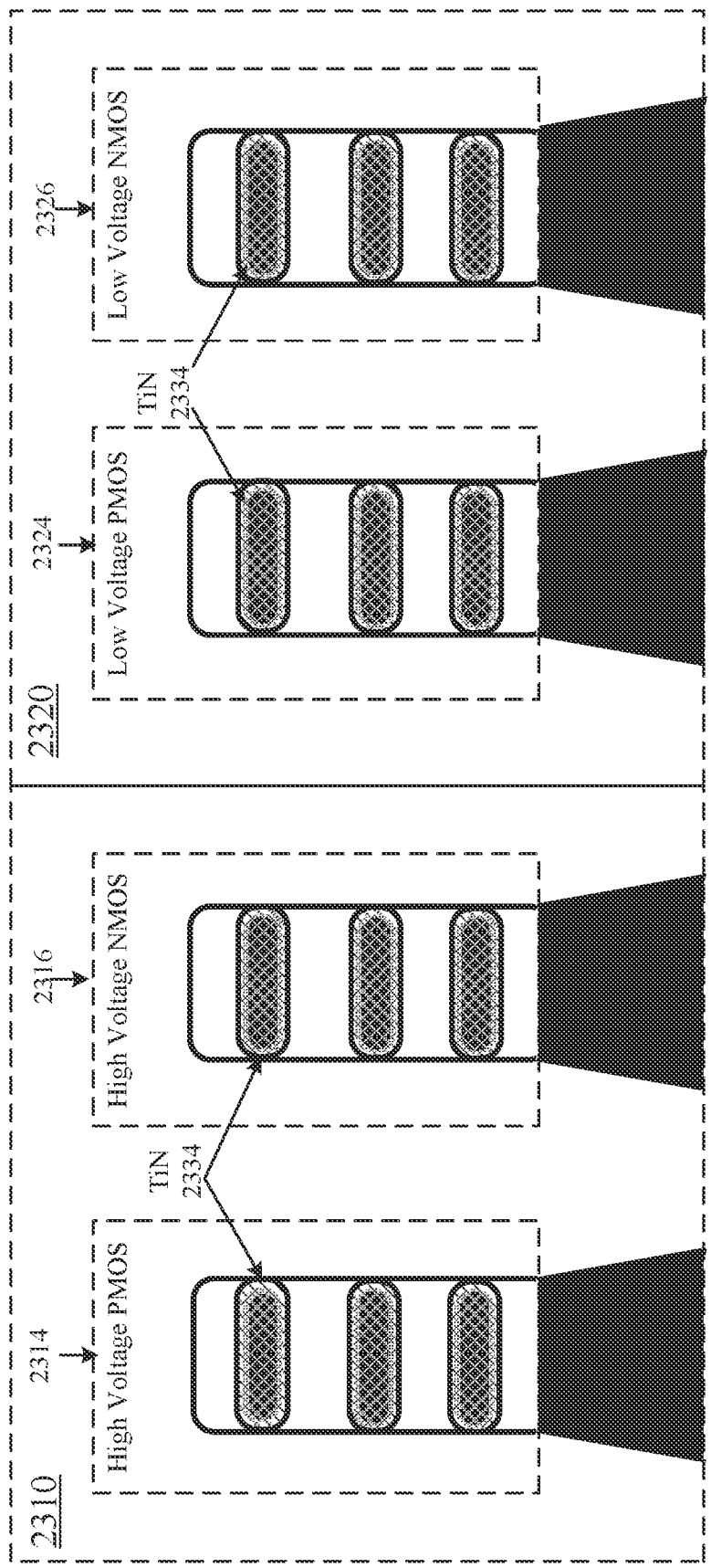
FIG. 23 illustrates selective deposition of a TiN cap over the top of the high-k film.

FIG. 23 illustrates the selective deposition of a TiN cap 2334 over the top the high-k film which is followed by a subsequent anneal process. Since all threshold voltage tuning will be done through selective deposition as opposed to a combined "additive then subtractive" process as is commonly used for high-end devices, there is no longer any need for etch stop layers such as low conductance TaN which occupy a significant volume of the overall HKMG stack. With the removal of these low conductance films, a significant improvement in overall gate resistance can be achieved, particularly for CFET devices in which the gates are stacked over the top of one another and which may need to share a common gate contact connection to M1.

Figure 24:
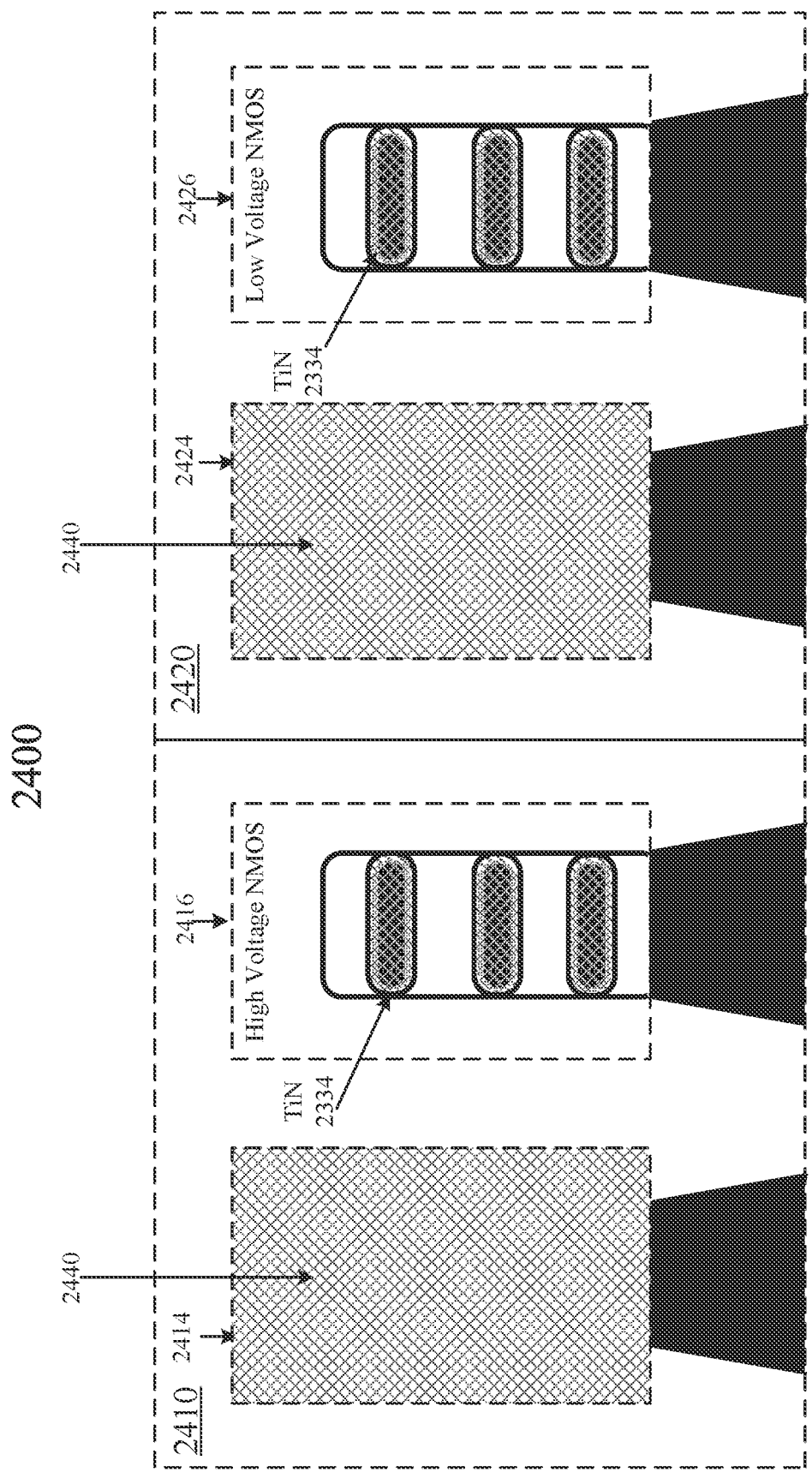
FIG. 24 illustrates patterning of a filling material.

FIG. 24 shows the patterning of a filling material such as spin-on carbon 2440 (SOC) to effectively keep the PMOS (both high threshold and low threshold conditions) gate "blocked" and the TiN capping metal 2334 for the NMOS (both high threshold and low threshold conditions) gates opened.

Figure 25:
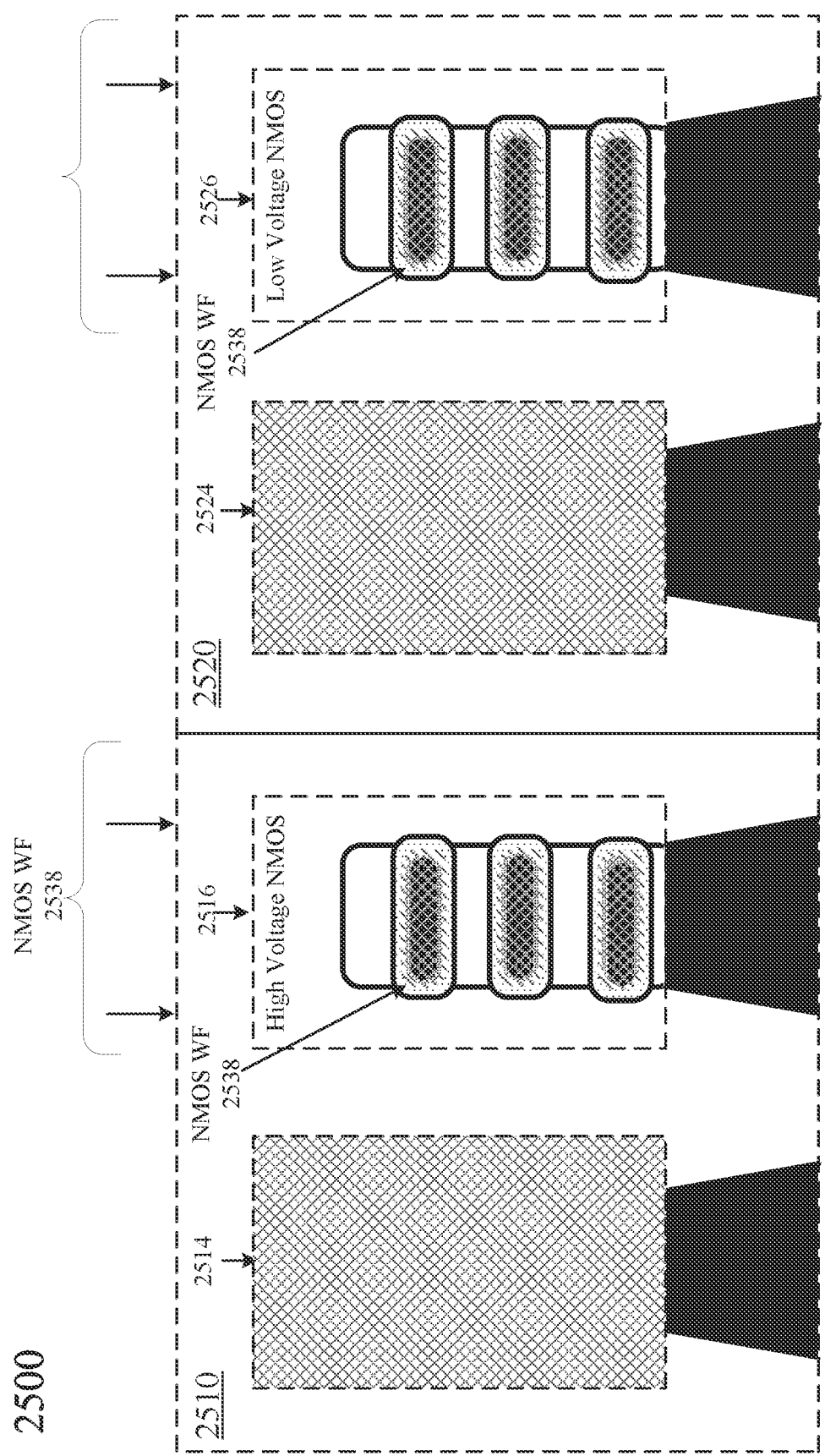
FIG. 25 shows the selective deposition of the NMOS work function metal across both the high and low threshold voltage conditions.

FIG. 25 shows selective deposition of the NMOS work function metal 2538 across both the high and low threshold voltage conditions. The SOC 2440 is "blocking" the surfaces of the PMOS gates (2514, 2524) which is preventing any deposition along these nanowires/nanosheets. A common thickness of NMOS work function metal 2538 is deposited in this case across both threshold voltage conditions with the intention of adding an additional work function thickness to the high threshold voltage condition later in the integration process. This approach minimizes the total number of threshold voltage litho modules which must be done in this process as a means of reducing overall complexity and cost. Alternatively, for very high number of threshold voltage conditions, each individual threshold voltage condition may be opened one at a time in order to do the required HKMG stack deposition, then closed and repeat for each individual $V_t$ tuning condition. Incorporation of the selective deposition capability for $V_t$ tuning may be optimized to the number of $V_t$ "flavors" required by the designers, the overall cost and the efficiency required by the integration flow.

Figure 26:
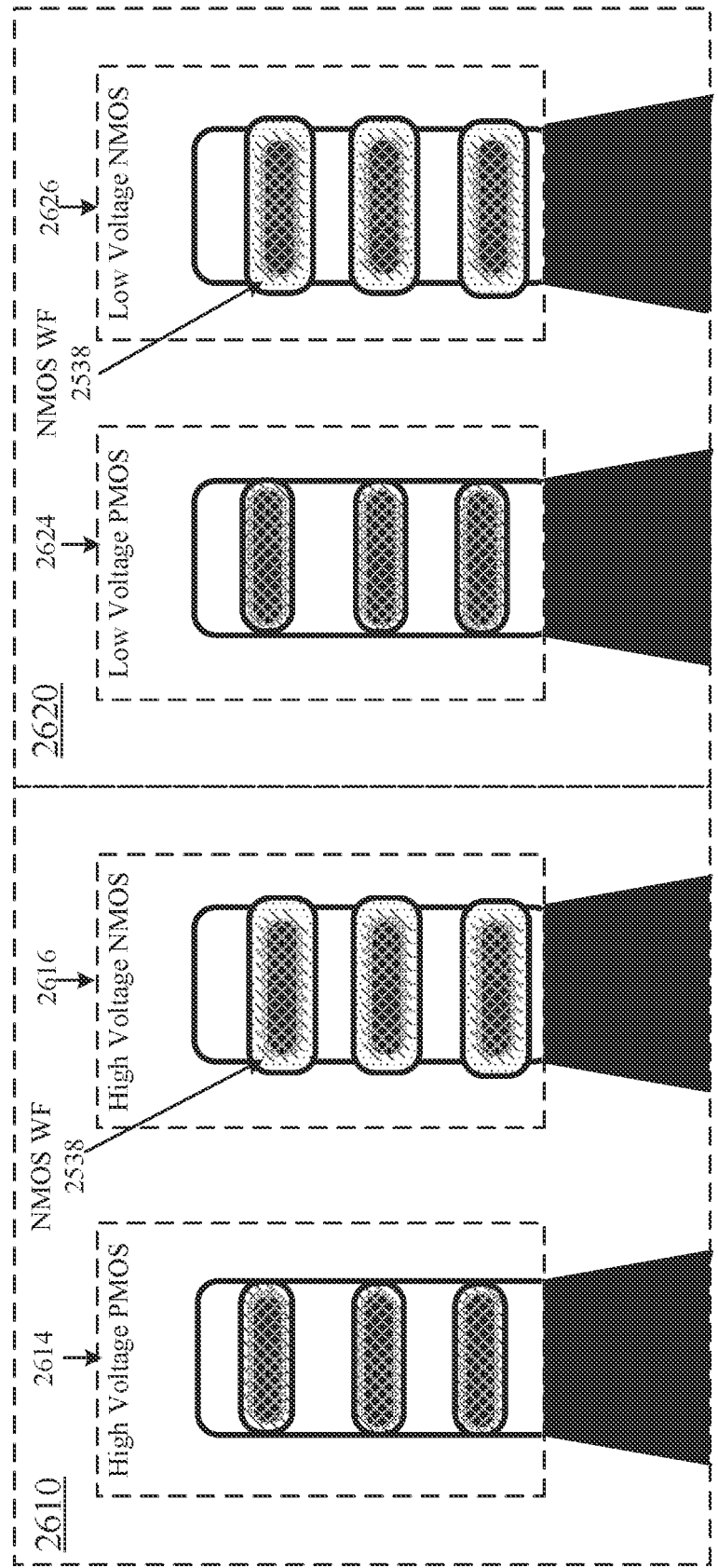
FIG. 26 shows the device after the filling material is removed.

FIG. 26 shows the HKMG stacks after the SOC filling material 2440 is removed.

Figure 27:
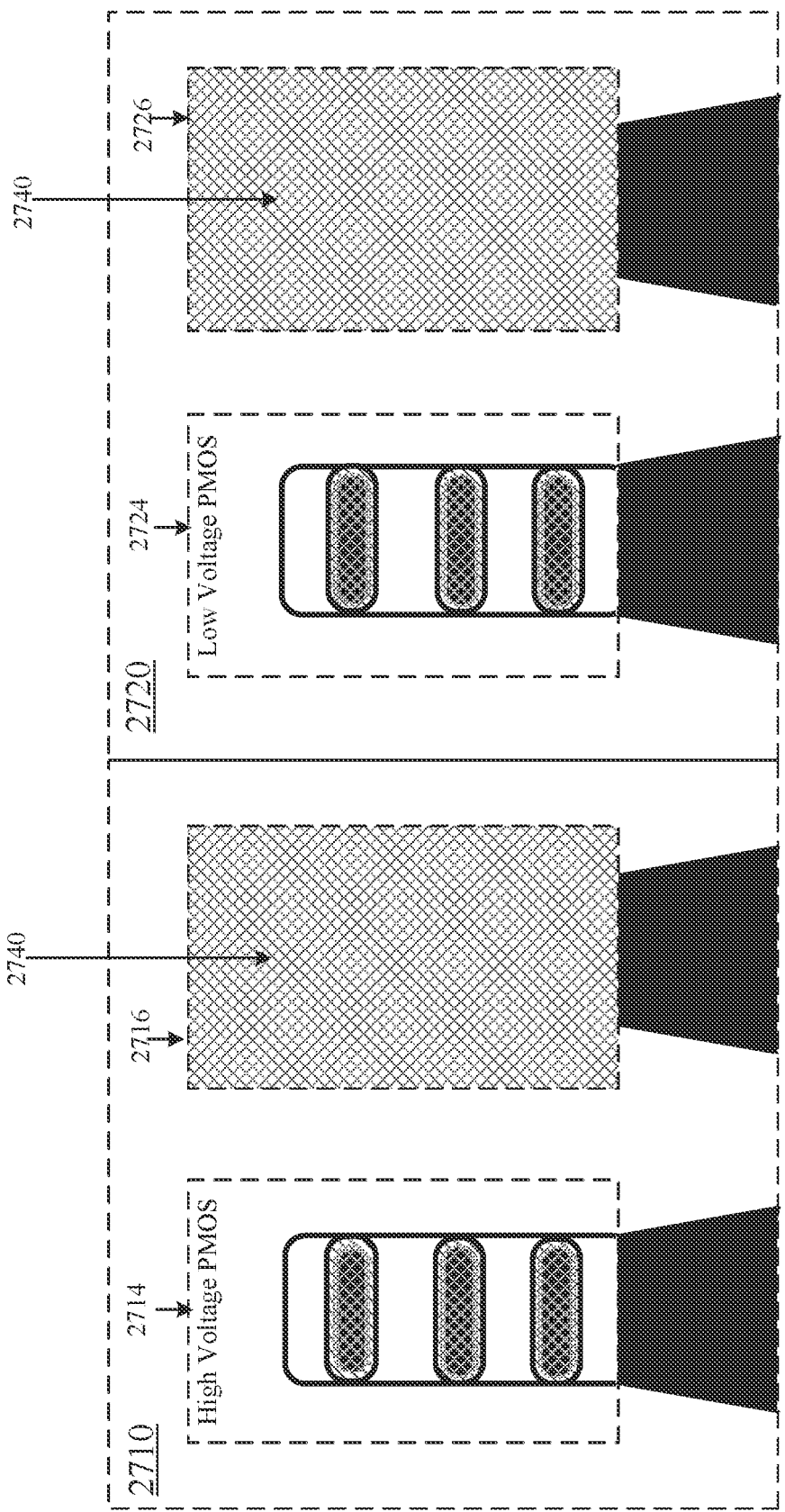
FIG. 27 depicts patterning of a filling material to effectively keep the NMOS gate "blocked" and the TiN capping metal for the PMOS to keep the gates open.

FIG. 27 illustrates the patterning of a filling material 2740 such as spin-on carbon (SOC) to effectively keep the NMOS (both high threshold 2716 and NMOS low threshold 2726 conditions) gates "blocked" and the TiN capping metal 2334 for the PMOS (both high threshold 2714 and PMOS low threshold 2724 conditions) gates opened.

Figure 28:
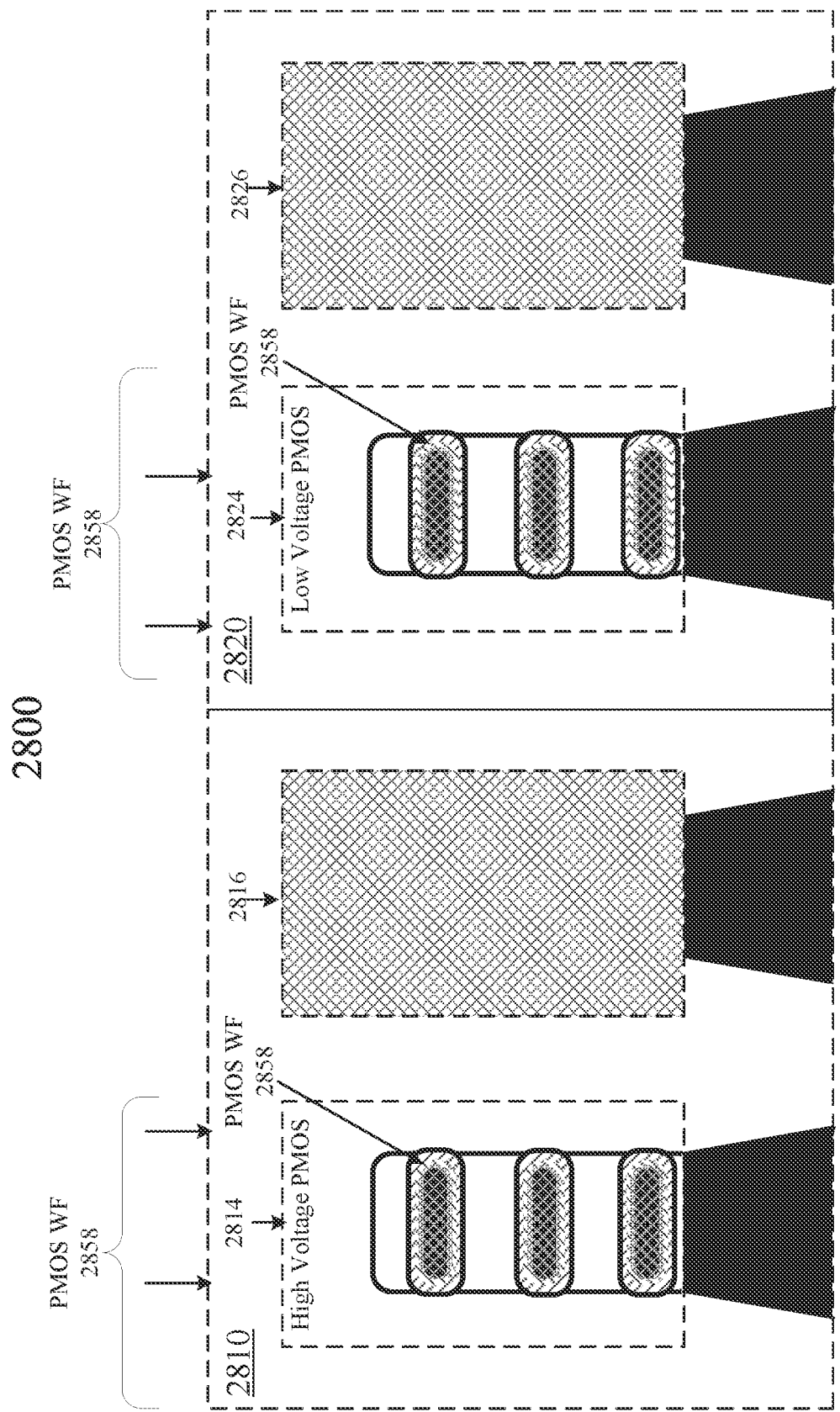
FIG. 28 depicts selective deposition of the PMOS work function metal across both the high and low threshold voltage conditions.

FIG. 28 depicts the selective deposition of the PMOS work function metal 2858 across both the high 2814 and low 2824 threshold voltage conditions. The SOC 2740 is "blocking" the surfaces of the NMOS gates (2816, 2826) which is preventing any deposition along these nanowires/nanosheets. A common thickness of PMOS work function metal, preferably TiN, is deposited across both threshold voltage conditions (2814, 2824) with the intention of adding additional work function thickness to the high threshold voltage condition later in the integration process. This approach minimizes the total number of threshold voltage litho modules which must be done in this process as a means of reducing overall complexity and cost. Alternatively, for very high number of threshold voltage conditions, each individual threshold voltage condition may be opened one at a time in order to do the required HKMG stack deposition, then closed and repeat for each individual $V_t$ tuning condition. Incorporation of the selective deposition capability for $V_t$ tuning may be optimized to the number of $V_t$ "flavors" required by the designers, the overall cost and the efficiency required by the integration flow.

Figure 29:
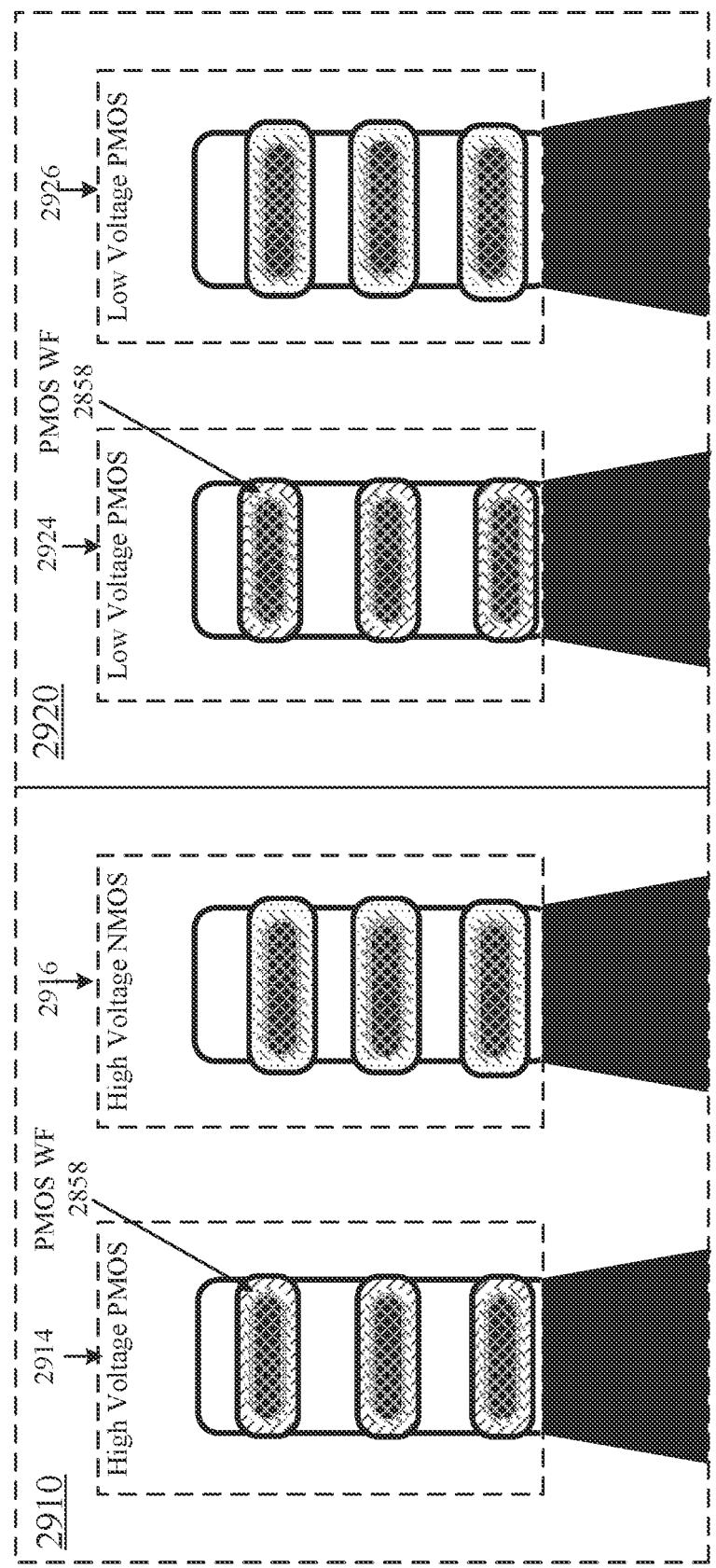
FIG. 29 depicts removal of the filling material.

FIG. 29 shows the HKMG stacks after the SOC filling material 2740 has been removed.

Figure 30:
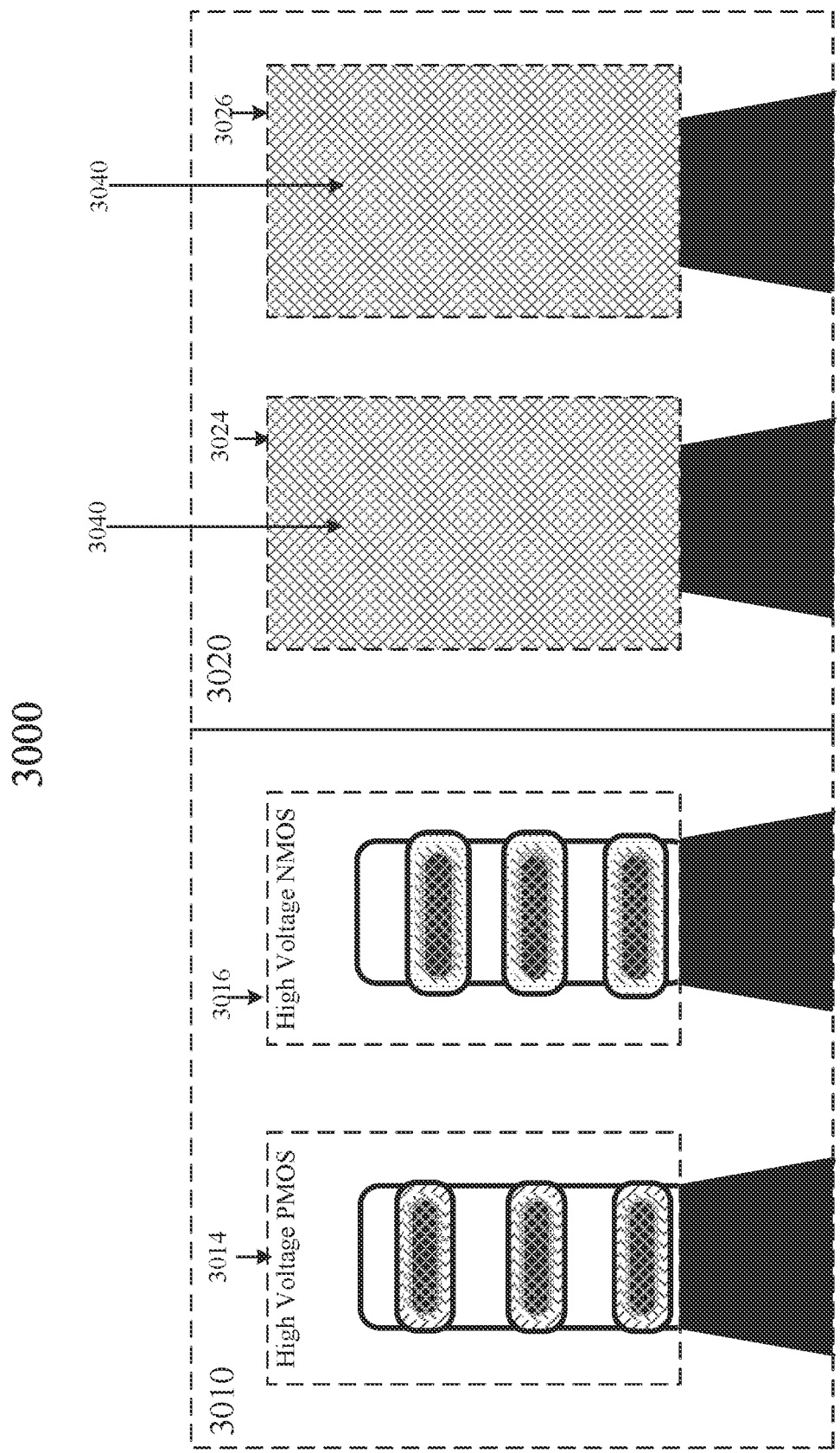
FIG. 30 shows patterning of a filling material.

FIG. 30 illustrates the patterning of a filling material such as spin-on carbon 3040 (SOC) to effectively keep the low threshold voltage conditions of both NMOS 3026 and PMOS 3024 "blocked" while the high-threshold voltage conditions of both NMOS 3016 and PMOS 3014 are opened within the replacement gate trench.

Figure 31:
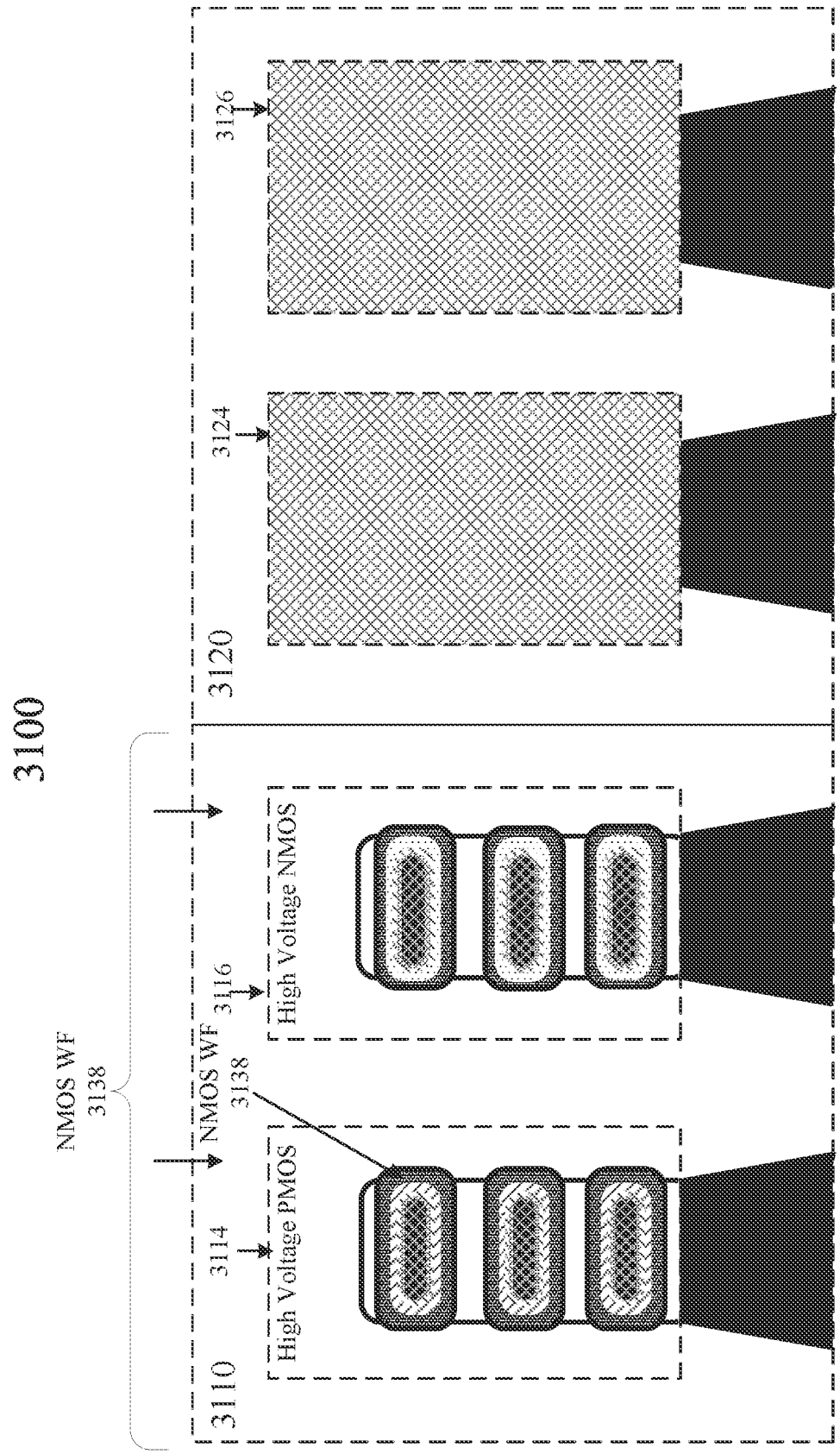
FIG. 31 shows selective deposition of additional NMOS work function metal across both the high threshold voltage conditions of both NMOS and PMOS.

FIG. 31 depicts the selective deposition of an additional NMOS work function metal 3138 across both the high threshold voltage conditions of both PMOS 3114 and NMOS 3116 stacks. In this manner, the NMOS threshold voltage adjustment may be made simply by the thickness difference of the work function metal, while the combined stack of PMOS work-function metals with deposition of NMOS work function metal 3138 for the PMOS transistors will be used for the threshold voltage tuning of the PMOS gate.

Figure 32:
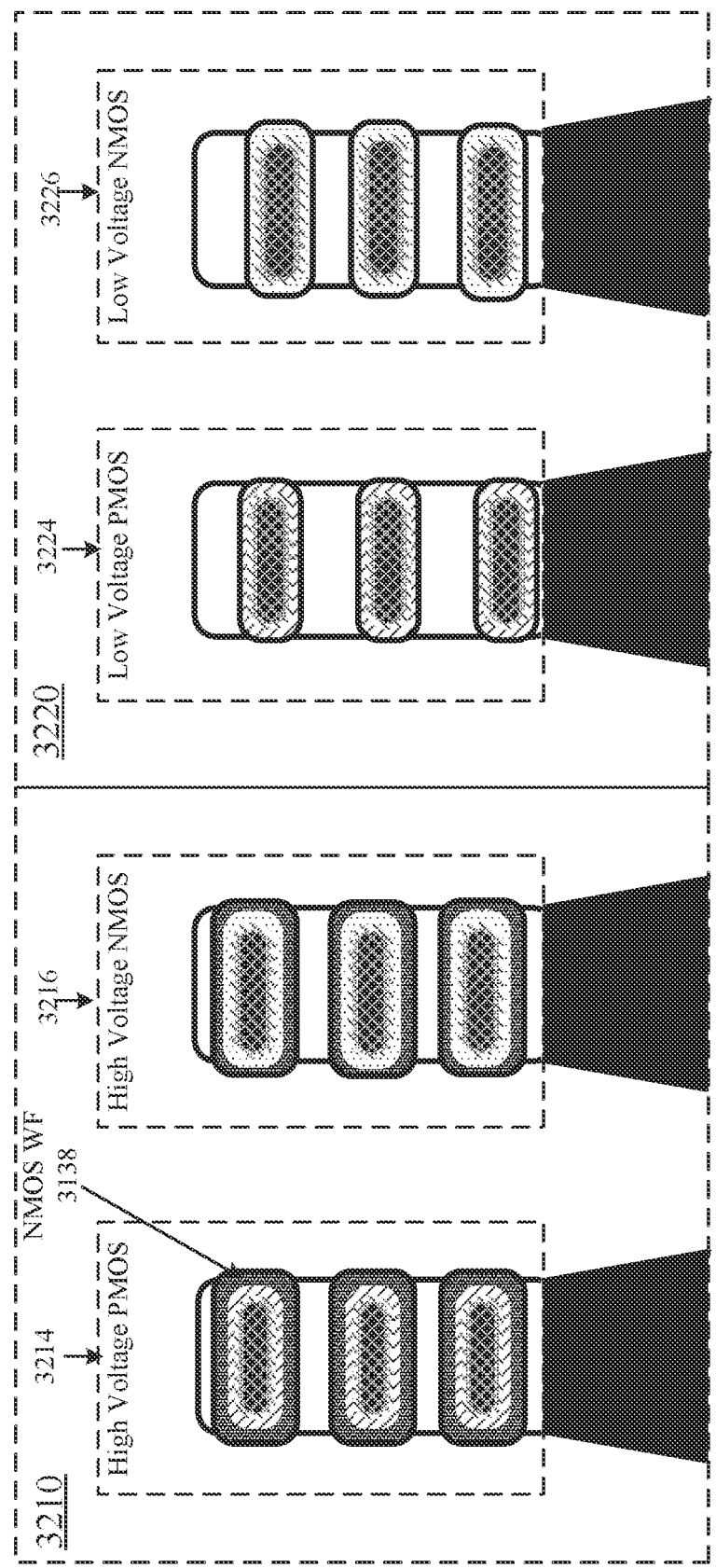
FIG. 32 shows the removal of the filling material.

FIG. 32 shows the HKMG stacks after the SOC filling material 3040 has been removed.

Figure 33:
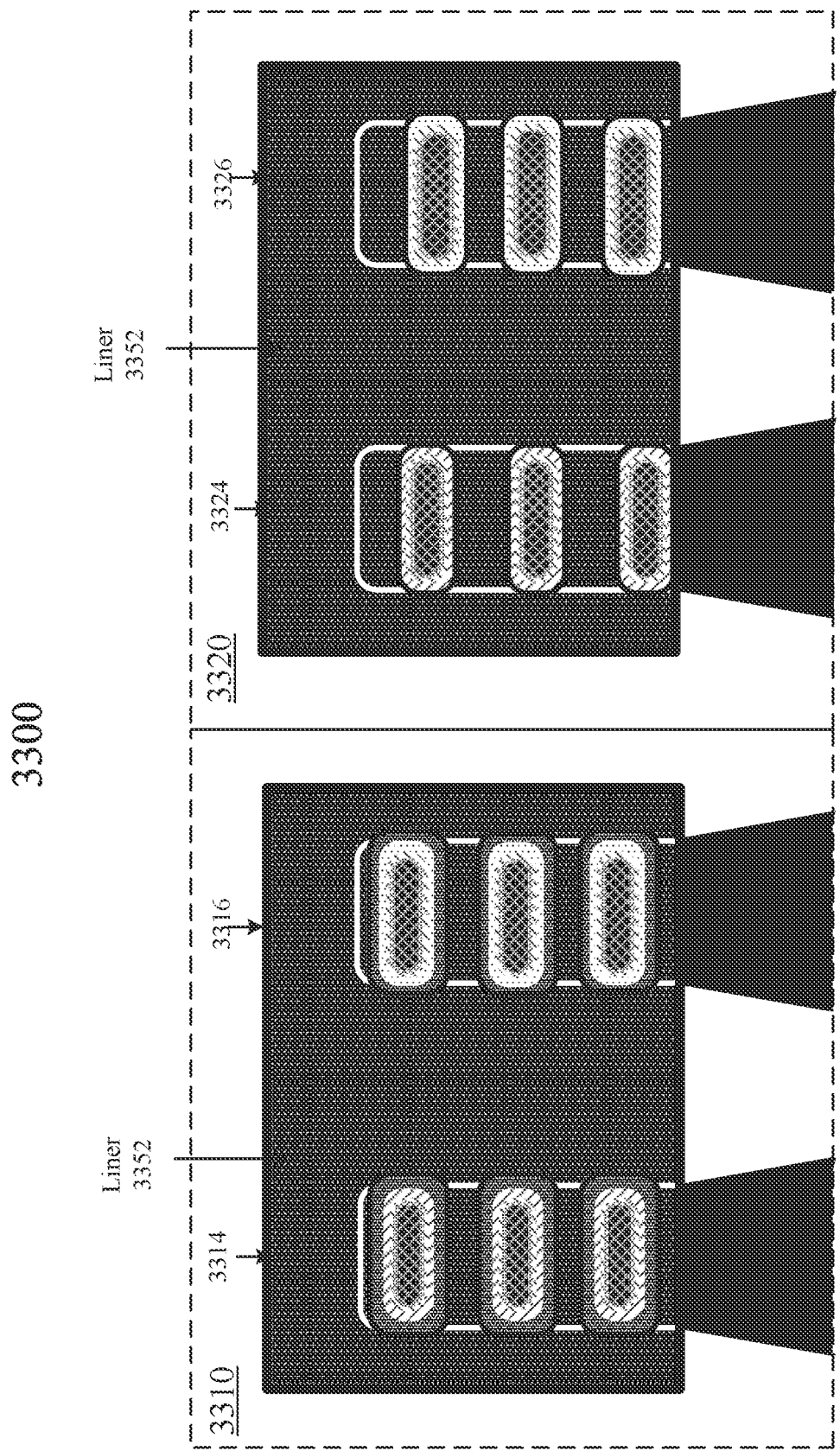
FIG. 33 illustrates isotropic deposition of liner material prior to the deposition of the high conductance metal fill to complete the HKMG stack.

FIG. 33 illustrates the isotropic deposition of liner material 3352 prior to the deposition of the high conductance metal fill to complete the HKMG stack. Typically TiN or TaN is used as the liner materials for cases where the high conductance fill material such as tungsten or cobalt are used. In this case, selective deposition for the TiN liner is not used as it is used as a "glue" layer for subsequent metal filling and as such the liner should be isotropically deposited within the trench. Ruthenium may be used as the high conductance fill material, in which case a liner material may not be required, however extensive physical simulation would be necessary as ruthenium leans toward being a p-type metal.

Figure 34:
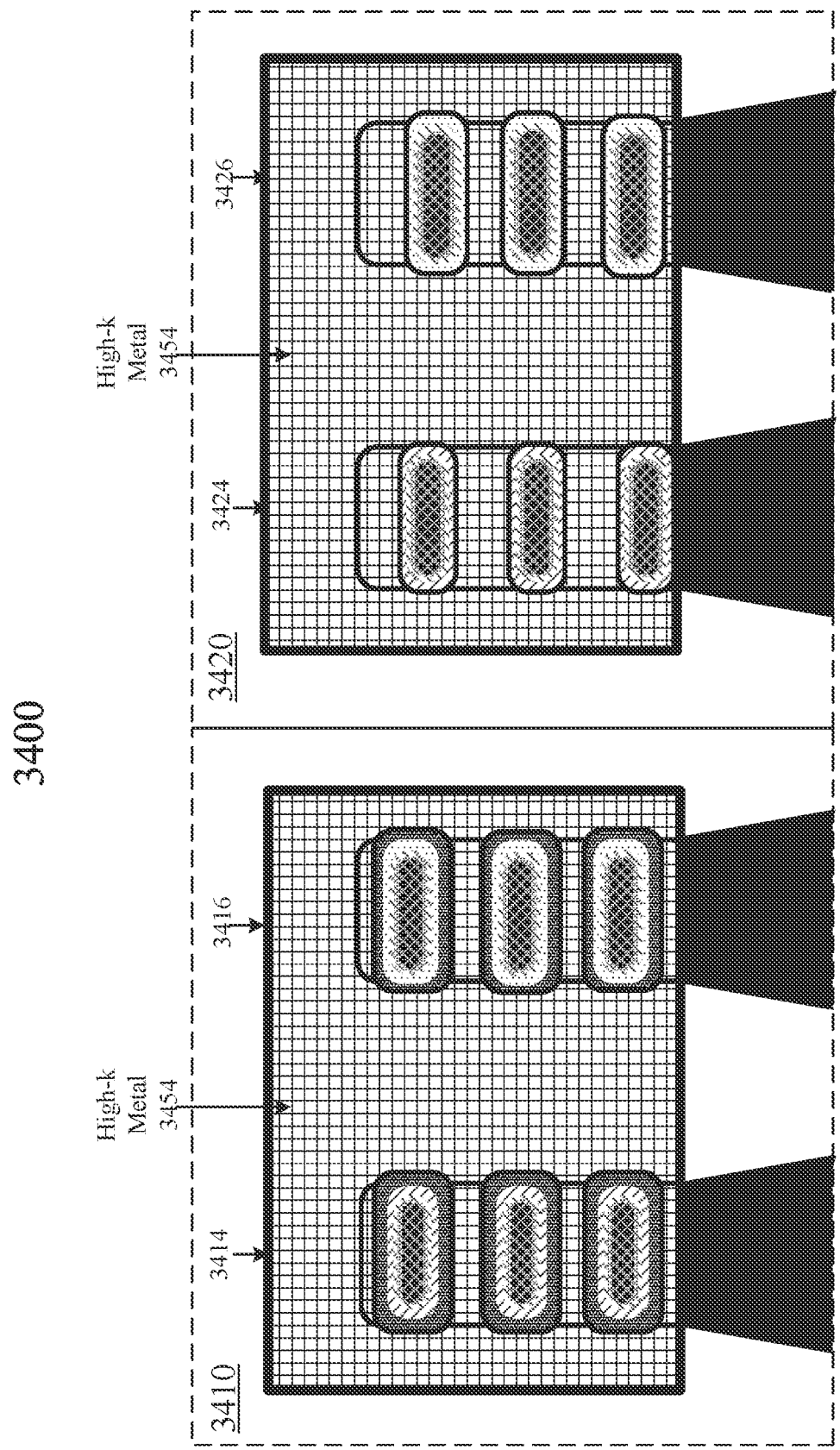
FIG. 34 illustrates filling of the high conductance metal material to complete the HKMG structure.

FIG. 34 depicts the filling of the high conductance metal material 3454 (tungsten assumed in this example) to complete the HKMG structure. The high conductance metal material fill all unoccupied areas within the trench and will surround the nanowire channels. Note that in the case of lateral nanosheets with the high threshold voltage condition, that the work function metals are no longer starting to merge between adjacent nanosheets and the floor of the replacement gate trench, as was the case for the isotropic deposition of the HKMG stack. Thus, the ability to tune threshold voltages through thickness adjustment of work function metals without the need of incorporating multiple etch stop layers can reduce the overall HKMG stack thickness surrounding the channels, thus providing a means for reducing the lateral pitch of the nanowires/nanosheets, which may provide a performance benefit for the transistor as well as improved electrostatics for the individual channels in the high threshold voltage condition.

Figure 35:
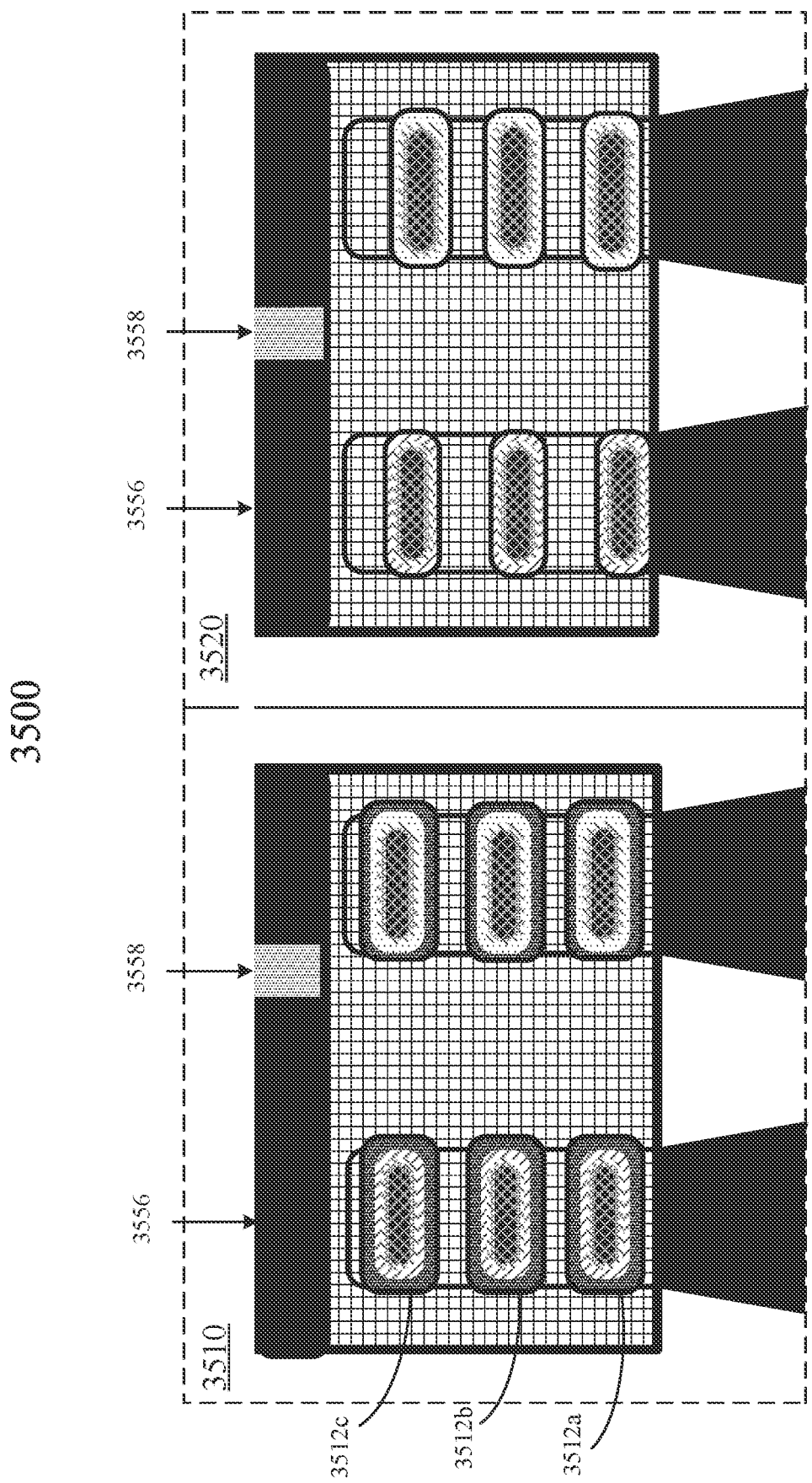
FIG. 35 shows the recess of the HKMG metal within the gate, formation of the SiN cap and subsequent formation of input gate contact to the common gate.

FIG. 35 depicts the recess filled by the HKMG metal within the gate, formation of the SiN cap 3556 and subsequent formation of an input gate contact 3558 to the common gate. The left side shows the high threshold voltage case for PMOS (left-hand side) and NMOS (right-hand side). The right side shows the low threshold voltage case for PMOS (left-hand side) and NMOS (right-hand side).

Comparison of the high voltage PMOS nanowires 2012a-c of FIG. 20 and the high voltage PMOS nanowires 3512a-c of FIG. 35 illustrate the improvement in isolation of each of the nanowires by the embodiment illustrated in FIG. 21-35.

The embodiment of FIG. 21-35 provides a gate all around nanowire/nanosheet transistor stack, with PMOS and an NMOS high voltage stacks and PMOS and an NMOS low voltage stacks, each stack having a different threshold voltage, $V_t$.

FIG. 21-35 describe a first claimed embodiment. The first embodiment describes a method of microfabrication, the method comprising receiving a substrate having channels for gate-all-around field-effect transistor devices, the channels including vertical stacks of channels positioned adjacent to each other in which individual channels extend horizontally between source/drain regions, wherein for each vertical stack of channels at least one channel is positioned above a second channel, the channels including at least four designated channel types including high voltage PMOS channels, high voltage NMOS channels, low voltage PMOS channels and low voltage NMOS channels; selectively depositing a first high-k dielectric all around uncovered channels including high voltage PMOS channels, high voltage NMOS channels, low voltage PMOS channels and low voltage NMOS channels; selectively depositing a first work function metal on each high voltage NMOS channel and each low voltage NMOS channel while the high voltage PMOS channels and the low voltage PMOS channels are covered; selectively depositing a second work function metal on each high voltage PMOS channel and each low voltage PMOS channel while the high voltage NMOS channels and the low voltage NMOS channels are covered; selectively depositing a third work function metal on each high voltage PMOS channel and each high voltage NMOS channel while the low voltage PMOS channels and the low voltage NMOS channels are covered; and depositing conductive metal material on the high voltage PMOS channels, the high voltage NMOS channels, the low voltage PMOS channels and the low voltage NMOS channels after deposition of the first, second and third work function metals.

The method further includes covering a portion of the high voltage NMOS channels and selectively depositing a second high-k dielectric on uncovered portions of the high voltage NMOS channels to result in different threshold voltages among high voltage NMOS channels, wherein the second high-k dielectric is the same or a different material than the first high-k dielectric.

The method further includes covering a portion of the high voltage PMOS channels and selectively depositing a second high-k dielectric on uncovered portions of high voltage PMOS channels to result in different threshold voltages among the high voltage PMOS channels, wherein the second high-k dielectric is the same or a different material than the first high-k dielectric.

The method further includes covering a portion of high voltage NMOS channels and selectively depositing a specific work function metal on uncovered portions of high voltage NMOS channels to result in different threshold voltages among high voltage NMOS channels.

The method further includes selectively depositing a first capping material on the first high-k dielectric subsequent to depositing the first high-k dielectric.

The method further includes wherein depositing the first high-k dielectric all around uncovered channels includes depositing the first high-k dielectric on all sides of a cross-section of the uncovered channels without depositing the first high-k dielectric on sidewalls of a replacement gate.

The method further includes forming high voltage channels with different gate stack thicknesses thereby resulting in different threshold voltages among high voltage channels.

The method further includes forming low voltage channels with different gate stack thicknesses thereby resulting in different threshold voltages among low voltage channels.

The method further includes selectively depositing a first titanium nitride (TiN) capping material on the first high-k dielectric subsequent to depositing the first high-k dielectric.

The method further includes annealing the vertical stacks of channels subsequent to depositing the first capping material and annealing the vertical stacks of channels subsequent to depositing the first titanium nitride capping material.

The method further includes wherein covering a portion of the high voltage NMOS channels comprises patterning a filling material all around the portion of the high voltage NMOS channels, wherein the filling material is spin-on carbon and removing the filling material subsequent to selectively depositing the first high-k dielectric on the uncovered portions of the high voltage NMOS channels.

The method further includes covering the high voltage PMOS channels and the low voltage PMOS channels with a filling material prior to selectively depositing the first work function metal on each high voltage NMOS channel and each low voltage NMOS channel and removing the filling material by wet etching subsequent to selectively depositing the first work function metal on each high voltage NMOS channel and each low voltage NMOS channel, covering the high voltage NMOS channels and the low voltage NMOS channels with the filling material prior to selectively depositing the second work function metal on each high voltage PMOS channel and each low voltage PMOS channel and removing the filling material by wet etching subsequent to selectively depositing the second work function metal on each high voltage PMOS channel and each low voltage PMOS channel, and covering the low voltage PMOS channels and the low voltage NMOS channels with the filling material by wet etching prior to selectively depositing the third work function metal on each high voltage PMOS channel and each high voltage NMOS channel and removing the filling material subsequent to selectively depositing the third work function metal on each high voltage PMOS channel and each high voltage NMOS channel.

The method further includes isotropically depositing a liner material on the high voltage PMOS channels, the high voltage NMOS channels, the low voltage PMOS channels and the low voltage NMOS channels prior to depositing the conductive metal material, selectively depositing each work function metal by one of atomic layer selective deposition (ALD) or chemical vapor selective deposition (CVD), selecting the liner material from the group consisting of tantallum nitride (TaN) and titanium nitride (TiN), selecting the conductive metal material from the group consisting of tungsten, cobalt, ruthenium, aluminum and alloys of aluminum, and selecting the work functions metals from the group consisting of titanium nitride (TiN), titanium oxy nitride (TiON), titanium aluminum (TiAl), titanium aluminum nitride (TiAlN), titanium carbide (TiC), and aluminum doped titanium carbide (TiAlC).

A second embodiment is illustrated with respect to FIG. 21-35. The second embodiment describes a method of microfabrication of vertical stacks of nano-channels, each vertical stack having a different voltage threshold, the method comprising receiving a substrate having channels for gate-all-around field-effect transistor devices, the channels including vertical stacks of nano-channels positioned adjacent to each other in which individual nano-channels extend horizontally between source/drain regions, wherein for each vertical stack of channels at least one nano-channel is positioned above a second nano-channel, the nano-channels including at least four designated nano-channel types including high voltage PMOS nano-channels, high voltage NMOS nano-channels, low voltage PMOS nano-channels and low voltage NMOS nano-channels, depositing a high-k film over each nano-channel, selectively depositing a titanium nitride (TiN) cap layer over the high-k film, annealing the substrate, patterning a first filling material over the vertical stacks of high voltage PMOS nano-channels and low voltage PMOS nano-channels, selectively depositing an NMOS work function metal over the TiN cap layer of the high voltage NMOS nano-channels and low voltage NMOS nano-channels, removing the first filling material from the vertical stacks of high voltage PMOS nano-channels and low voltage PMOS nano-channels, patterning a second filling material over the vertical stacks of high voltage NMOS nano-channels and low voltage NMOS nano-channels, selectively depositing a PMOS work function metal over the TiN cap layer of the high voltage NMOS nano-channels and low voltage NMOS nano-channels, removing the second filling material from the vertical stacks of high voltage NMOS nano-channels and low voltage NMOS nano-channels, patterning a third filling material over the vertical stacks of PMOS low voltage and NMOS low voltage nano-channels, selectively depositing an NMOS work function metal over the verticals stacks of PMOS high voltage and NMOS high voltage nano-channels, patterning the third filling material from the vertical stacks of PMOS low voltage and NMOS low voltage nano-channels, filling each vertical stack with a liner material, filling each vertical stack with a high conductance metal material, forming a first silicon nitride (SiN) cap over the high voltage stacks and a second silicon nitride (SiN) cap over the low voltage stacks, and forming a first input gate contact in first silicon nitride cap and a second input gate contact in the second silicon nitride cap.

The method of the second embodiment includes selectively depositing each work function metal by one of atomic layer selective deposition (ALD) or chemical vapor selective deposition (CVD).

A third embodiment is illustrated with respect to FIG. 21-35. The third embodiment describes a three dimensional transistor stack, comprising a substrate having vertical stacks of channels for gate-all-around field-effect transistor devices, the vertical stacks of channels positioned adjacent to each other in which individual channels extend horizontally between source/drain regions, wherein, in each vertical stack of channels, at least one channel is positioned above a second channel, a first vertical stack of high voltage NMOS channels, wherein each channel is surrounded by a first high-k dielectric, a first work function metal, a third work function metal, and a conductive metal material, a second vertical stack of low voltage NMOS channels, wherein each channel is surrounded by the first high-k dielectric, the first work function metal, and a conductive metal material, a third vertical stack of high voltage PMOS channels, wherein each channel is surrounded by the first high-k dielectric, a second work function metal, a third work function metal, and a conductive metal material, a fourth vertical stack of low voltage PMOS channels, wherein each channel is surrounded by the first high-k dielectric, the second work function metal, and a conductive metal material, a capping material over the conductive metal material, and an input gate contact connected to the conductive metal material.

Obviously, numerous modifications and variations of the present disclosure are possible in light of the above teachings. It is therefore to be understood that within the scope of the appended claims, the invention may be practiced otherwise than as specifically described herein.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

There can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:
1. A three dimensional transistor stack, comprising
a substrate having vertical stacks of channels for gate-all-around field-effect transistor devices, the vertical stacks of channels positioned adjacent to each other in which individual channels extend horizontally between source/drain regions, wherein each vertical stack of channels is positioned above a respective lower block of substrate material which is different from a channel material of the channels and comprises at least one channel positioned above a second channel;

a first vertical stack of high voltage NMOS channels, wherein each channel is surrounded by a first high-k dielectric; a first work function metal; a third work function metal; and a conductive metal material;

a second vertical stack of low voltage NMOS channels, wherein each channel is surrounded by the first high-k dielectric; the first work function metal; and the conductive metal material;

a third vertical stack of high voltage PMOS channels, wherein each channel is surrounded by the first high-k dielectric; a second work function metal; the third work function metal; and the conductive metal material;

a fourth vertical stack of low voltage PMOS channels, wherein each channel is surrounded by the first high-k dielectric; the second work function metal; and the conductive metal material;

a capping material over the conductive metal material; and an input gate contact connected to the conductive metal material, wherein a respective lower block of at least one of the first, second, third and fourth vertical stacks does not include the first high-k dielectric thereon due to selective deposition of the first high-k dielectric on the channel material without depositing the first high-k dielectric on the lower block of substrate material.

2. The three dimensional transistor stack of claim 1, wherein a respective lower block of each of the first, second, third and fourth vertical stacks does not include the first high-k dielectric thereon.

3. The three dimensional transistor stack of claim 1, wherein a respective lower block of at least one of the first, second, third and fourth vertical stacks does not include any work function metal thereon.

4. The three dimensional transistor stack of claim 2, wherein a respective lower block of each of the first, second, third and fourth vertical stacks does not include any work function metal thereon.

5. The three dimensional transistor stack of claim 1, further comprising a first common gate structure surrounding one of:
all of the high voltage NMOS and the high voltage PMOS channels; and
all of the low voltage NMOS and the low voltage PMOS channels.

6. The three dimensional transistor stack of claim 5, further comprising:

a second common gate structure surrounding the other of:
all of the high voltage NMOS and the high voltage PMOS channels; and
all of the low voltage NMOS and the low voltage PMOS channels.

7. The three dimensional transistor stack of claim 1, wherein each of the first, second, third and fourth vertical stacks comprises three or more channels vertically aligned and positioned above one another.

8. The three dimensional transistor stack of claim 1, wherein the first high-k dielectric is HfO.

9. The three dimensional transistor stack of claim 1, wherein at least one of the first, second, third and fourth vertical stacks comprises an interface oxide provided between a channel and the first high-k dielectric.

10. The three dimensional transistor stack of claim 1, wherein at least one of the first, second, third and fourth vertical stacks comprises a cap layer provided between the first high-k dielectric and a work function metal provided on the first high-k dielectric.

11. The three dimensional transistor stack of claim 10, wherein the cap layer is TiN.

12. The three dimensional transistor stack of claim 1, wherein the first work function metal is an NMOS work function metal.

13. The three dimensional transistor stack of claim 12, wherein the NMOS work function metal comprises TiAlN.

14. The three dimensional transistor stack of claim 1, wherein the third work function metal is an NMOS work function metal.

15. The three dimensional transistor stack of claim 14, wherein the NMOS work function metal comprises TiN.

16. The three dimensional transistor stack of claim 1, wherein the second work function metal is an PMOS work function metal.

17. The three dimensional transistor stack of claim 16, wherein the PMOS work function metal comprises TiN.

18. The three dimensional transistor stack of claim 1, wherein at least one of the first, second, third and fourth vertical stacks comprises a liner provided between a work function metal and a conductive metal, the liner comprising at least one of TiN and TaN.

19. The three dimensional transistor stack of claim 1, wherein the conductive metal comprises Tungsten or Cobalt.

20. The three dimensional transistor stack of claim 1, wherein none of the first, second, third and fourth vertical stacks comprises an etch stop layer.

* * * * *